(12) United States Patent
Malhotra et al.

(10) Patent No.: US 11,594,672 B2
(45) Date of Patent: Feb. 28, 2023

(54) SPATIALLY ADDRESSABLE NANOVOIDED POLYMERS

(71) Applicant: META PLATFORMS TECHNOLOGIES, LLC, Menlo Park, CA (US)

(72) Inventors: Tanya Malhotra, Redmond, WA (US); Kenneth Diest, Kirkland, WA (US); Andrew John Ouderkirk, Redmond, WA (US); Robin Sharma, Redmond, WA (US); Barry Silverstein, Redmond, WA (US); Christopher Yuan Ting Liao, Seattle, WA (US); Erik Shipton, Kenmore, WA (US); Greg Olegovic Andreev, Kirkland, WA (US); Katherine Marie Smyth, Seattle, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 878 days.

(21) Appl. No.: 16/417,911

(22) Filed: May 21, 2019

(65) Prior Publication Data
US 2020/0185590 A1 Jun. 11, 2020

Related U.S. Application Data

(60) Provisional application No. 62/777,825, filed on Dec. 11, 2018.

(51) Int. Cl.
*H01L 41/047* (2006.01)
*H01L 41/193* (2006.01)
(Continued)

(52) U.S. Cl.
CPC ........... *H01L 41/193* (2013.01); *B05D 3/067* (2013.01); *B05D 3/101* (2013.01); *B05D 3/108* (2013.01);
(Continued)

(58) Field of Classification Search
CPC .................. H01L 41/0471; H01L 41/193
See application file for complete search history.

(56) References Cited

U.S. PATENT DOCUMENTS

| 3,215,583 A | 11/1965 | Holme |
| 3,985,599 A | 10/1976 | Lepoutre et al. |

(Continued)

FOREIGN PATENT DOCUMENTS

| CA | 2737458 A1 | 3/2010 | |
| CN | 1870930 A * | 11/2006 | ......... A61B 1/00006 |

(Continued)

OTHER PUBLICATIONS

Correa D.M., et al., "Negative Stiffness Honeycombs for Recoverable Shock Isolation," Rapid Prototyping Journal, 2015, vol. 21 (2), pp. 702-713.

(Continued)

*Primary Examiner* — Jarrett J Stark
(74) *Attorney, Agent, or Firm* — Greenberg Traurig, LLP

(57) ABSTRACT

Examples include a device including a nanovoided polymer element having a first surface and a second surface, a first plurality of electrodes disposed on the first surface, a second plurality of electrodes disposed on the second surface, and a control circuit configured to apply an electrical potential between one or more of the first plurality of electrodes and one or more of the second plurality of electrodes to induce a physical deformation of the nanovoided polymer element.

20 Claims, 15 Drawing Sheets

(51) Int. Cl.

| | | |
|---|---|---|
| H01L 41/09 | (2006.01) | |
| H04R 17/00 | (2006.01) | |
| G02B 27/01 | (2006.01) | |
| G02F 1/01 | (2006.01) | |
| G02F 1/061 | (2006.01) | |
| G02B 5/08 | (2006.01) | |
| G02B 5/30 | (2006.01) | |
| G02B 27/10 | (2006.01) | |
| G06F 3/01 | (2006.01) | |
| C08F 14/20 | (2006.01) | |
| C08F 14/22 | (2006.01) | |
| C08G 77/04 | (2006.01) | |
| H01L 41/083 | (2006.01) | |
| H01L 41/18 | (2006.01) | |
| G02B 5/18 | (2006.01) | |
| F21V 8/00 | (2006.01) | |
| G02F 1/29 | (2006.01) | |
| H01L 41/04 | (2006.01) | |
| H01L 41/253 | (2013.01) | |
| H02N 1/00 | (2006.01) | |
| B05D 3/06 | (2006.01) | |
| B05D 3/10 | (2006.01) | |
| G02C 7/08 | (2006.01) | |
| G06T 19/00 | (2011.01) | |
| G06V 20/20 | (2022.01) | |
| C08J 9/00 | (2006.01) | |
| C08J 9/04 | (2006.01) | |
| C08J 9/28 | (2006.01) | |
| G02B 1/04 | (2006.01) | |
| G02F 1/00 | (2006.01) | |
| G02F 1/065 | (2006.01) | |
| G02F 1/225 | (2006.01) | |
| B29C 55/00 | (2006.01) | |
| B32B 27/20 | (2006.01) | |
| B32B 38/00 | (2006.01) | |
| B32B 38/10 | (2006.01) | |
| B29D 11/00 | (2006.01) | |
| G02B 3/00 | (2006.01) | |
| G02B 5/04 | (2006.01) | |
| C08L 83/04 | (2006.01) | |
| B82Y 30/00 | (2011.01) | |
| B82Y 40/00 | (2011.01) | |
| G02B 7/04 | (2021.01) | |
| G02B 26/00 | (2006.01) | |
| G02B 3/12 | (2006.01) | |
| B32B 27/30 | (2006.01) | |
| B32B 33/00 | (2006.01) | |
| B29K 105/04 | (2006.01) | |

(52) U.S. Cl.
CPC ...... *B29C 55/005* (2013.01); *B29D 11/00355* (2013.01); *B32B 27/205* (2013.01); *B32B 38/0012* (2013.01); *B32B 38/10* (2013.01); *C08F 14/20* (2013.01); *C08F 14/22* (2013.01); *C08G 77/04* (2013.01); *C08J 9/0061* (2013.01); *C08J 9/04* (2013.01); *C08J 9/286* (2013.01); *G02B 1/04* (2013.01); *G02B 1/041* (2013.01); *G02B 3/00* (2013.01); *G02B 3/0012* (2013.01); *G02B 5/045* (2013.01); *G02B 5/08* (2013.01); *G02B 5/1847* (2013.01); *G02B 5/3083* (2013.01); *G02B 6/0026* (2013.01); *G02B 27/0172* (2013.01); *G02B 27/0176* (2013.01); *G02B 27/10* (2013.01); *G02C 7/083* (2013.01); *G02F 1/0018* (2013.01); *G02F 1/0102* (2013.01); *G02F 1/061* (2013.01); *G02F 1/065* (2013.01); *G02F 1/225* (2013.01); *G02F 1/292* (2013.01); *G06F 3/011* (2013.01); *G06F 3/014* (2013.01); *G06F 3/016* (2013.01); *G06T 19/006* (2013.01); *G06V 20/20* (2022.01); *H01L 41/04* (2013.01); *H01L 41/042* (2013.01); *H01L 41/047* (2013.01); *H01L 41/0472* (2013.01); *H01L 41/083* (2013.01); *H01L 41/09* (2013.01); *H01L 41/0913* (2013.01); *H01L 41/0986* (2013.01); *H01L 41/18* (2013.01); *H01L 41/253* (2013.01); *H02N 1/006* (2013.01); *H04R 17/00* (2013.01); *B05D 2201/02* (2013.01); *B05D 2350/30* (2013.01); *B05D 2400/00* (2013.01); *B05D 2502/00* (2013.01); *B05D 2503/00* (2013.01); *B05D 2504/00* (2013.01); *B05D 2505/00* (2013.01); *B05D 2518/12* (2013.01); *B29C 55/00* (2013.01); *B29K 2105/04* (2013.01); *B29K 2995/0026* (2013.01); *B32B 27/304* (2013.01); *B32B 33/00* (2013.01); *B32B 2038/0028* (2013.01); *B32B 2305/026* (2013.01); *B82Y 30/00* (2013.01); *B82Y 40/00* (2013.01); *C08J 2201/05* (2013.01); *C08J 2205/04* (2013.01); *C08J 2205/042* (2013.01); *C08J 2325/06* (2013.01); *C08J 2333/00* (2013.01); *C08J 2463/00* (2013.01); *C08J 2475/04* (2013.01); *C08J 2479/02* (2013.01); *C08J 2483/04* (2013.01); *C08L 83/04* (2013.01); *G02B 3/0087* (2013.01); *G02B 3/12* (2013.01); *G02B 7/04* (2013.01); *G02B 26/00* (2013.01); *G02B 2027/0178* (2013.01); *G02B 2207/101* (2013.01); *G02B 2207/107* (2013.01); *G02F 2202/022* (2013.01)

(56) References Cited

U.S. PATENT DOCUMENTS

| | | | |
|---|---|---|---|
| 4,613,544 A | 9/1986 | Burleigh | |
| 5,095,515 A * | 3/1992 | Seaver | G02F 1/3131 385/16 |
| 6,376,971 B1 * | 4/2002 | Pelrine | F04B 35/045 977/788 |
| 6,420,441 B1 | 7/2002 | Allen et al. | |
| 6,488,721 B1 | 12/2002 | Carlson | |
| 6,628,850 B1 | 9/2003 | Yao | |
| 6,930,439 B2 * | 8/2005 | Wierach | H01L 41/0475 310/330 |
| 7,002,754 B2 | 2/2006 | Baer et al. | |
| 7,230,771 B2 | 6/2007 | Kuiper et al. | |
| 7,298,017 B1 * | 11/2007 | Liu | F03G 7/005 257/420 |
| 7,573,064 B2 * | 8/2009 | Benslimane | H01L 41/333 257/306 |
| 7,733,000 B2 * | 6/2010 | Kudoh | F03G 7/005 310/330 |
| 7,872,396 B2 * | 1/2011 | Chiang | H01M 4/485 310/330 |
| 7,880,371 B2 * | 2/2011 | Benslimane | H01L 41/45 310/800 |
| 7,999,435 B2 * | 8/2011 | Chiang | F03G 7/005 310/311 |
| 8,247,946 B2 * | 8/2012 | Chiang | F03G 7/005 310/330 |
| 8,368,285 B2 * | 2/2013 | Chiang | H01M 4/134 310/311 |
| 8,477,402 B2 | 7/2013 | Duncan et al. | |
| 8,564,181 B2 | 10/2013 | Choi et al. | |
| 8,848,280 B2 | 9/2014 | Arsenault | |
| 9,228,822 B2 | 1/2016 | Majidi et al. | |
| 9,478,727 B2 * | 10/2016 | Böse | H01L 41/0471 |

(56) References Cited

U.S. PATENT DOCUMENTS

| | | | |
|---|---|---|---|
| 9,618,739 B2* | 4/2017 | Brokken | G02B 26/0875 |
| 9,761,790 B2* | 9/2017 | Yoo | H01L 41/45 |
| 9,820,481 B2 | 11/2017 | Hani et al. | |
| 9,876,160 B2* | 1/2018 | Biggs | H01L 41/193 |
| 9,923,180 B2 | 3/2018 | Thomas-Alyea et al. | |
| 10,036,674 B2* | 7/2018 | Orita | G01D 18/00 |
| 10,629,800 B2* | 4/2020 | Gong | H02N 2/185 |
| 10,670,782 B2 | 6/2020 | Arbabi et al. | |
| 10,690,946 B2 | 6/2020 | Wilson | |
| 10,749,448 B2 | 8/2020 | Lindsay et al. | |
| 10,797,217 B2 | 10/2020 | Hakkens et al. | |
| 11,022,856 B1 | 6/2021 | Ouderkirk et al. | |
| 11,025,175 B1 | 6/2021 | Landig et al. | |
| 11,256,331 B1* | 2/2022 | Diest | G06F 3/0447 |
| 2002/0009251 A1 | 1/2002 | Byrne | |
| 2002/0135863 A1 | 9/2002 | Fukshima et al. | |
| 2002/0186928 A1 | 12/2002 | Curtis | |
| 2005/0007675 A1 | 1/2005 | Matsumoto et al. | |
| 2005/0196552 A1 | 9/2005 | Lehmann et al. | |
| 2006/0024976 A1 | 2/2006 | Waldfried et al. | |
| 2006/0028734 A1 | 2/2006 | Kuiper et al. | |
| 2007/0020404 A1 | 1/2007 | Seiberle et al. | |
| 2007/0152982 A1* | 7/2007 | Kim | G06F 3/016 345/173 |
| 2007/0205398 A1 | 9/2007 | Smela et al. | |
| 2007/0263963 A1 | 11/2007 | Hughes et al. | |
| 2008/0043515 A1* | 2/2008 | Bloch | G11C 13/02 365/153 |
| 2008/0137031 A1 | 6/2008 | Hillis et al. | |
| 2008/0171431 A1 | 7/2008 | Yu et al. | |
| 2008/0197518 A1 | 8/2008 | Aylward et al. | |
| 2008/0224103 A1 | 9/2008 | Arsenault et al. | |
| 2008/0257718 A1* | 10/2008 | Chiang | H01M 50/409 204/242 |
| 2009/0014320 A1* | 1/2009 | Chiang | F03G 7/005 204/252 |
| 2009/0034051 A1 | 2/2009 | Arsenault et al. | |
| 2009/0296188 A1 | 12/2009 | Jain et al. | |
| 2010/0075056 A1 | 3/2010 | Axisa et al. | |
| 2011/0042204 A1* | 2/2011 | Chiang | F03G 7/005 204/242 |
| 2011/0149410 A1 | 6/2011 | Blum | |
| 2011/0242638 A1 | 10/2011 | Horning et al. | |
| 2011/0275996 A1* | 11/2011 | Gyory | A61M 5/16877 604/131 |
| 2012/0019185 A1 | 1/2012 | Guidarelli et al. | |
| 2012/0029416 A1 | 2/2012 | Parker et al. | |
| 2012/0200931 A1 | 8/2012 | Haag et al. | |
| 2012/0211261 A1* | 8/2012 | Aabloo | F03G 7/00 174/126.1 |
| 2012/0298200 A1 | 11/2012 | Niggemann et al. | |
| 2013/0176628 A1 | 7/2013 | Batchko et al. | |
| 2013/0202867 A1 | 8/2013 | Coggio et al. | |
| 2013/0222881 A1 | 8/2013 | Aizenberg et al. | |
| 2013/0279151 A1 | 10/2013 | Ouderkirk et al. | |
| 2013/0335807 A1 | 12/2013 | Arsenault et al. | |
| 2014/0133010 A1 | 5/2014 | Han et al. | |
| 2014/0204372 A1 | 7/2014 | Pang et al. | |
| 2014/0217539 A1 | 8/2014 | Rantala | |
| 2014/0234995 A1 | 8/2014 | Li et al. | |
| 2014/0266647 A1 | 9/2014 | Visitacion et al. | |
| 2014/0312737 A1 | 10/2014 | Jenninger et al. | |
| 2014/0323603 A1 | 10/2014 | Kolb et al. | |
| 2014/0326292 A1 | 11/2014 | Yordem et al. | |
| 2014/0350528 A1* | 11/2014 | Chiang | A61M 5/148 604/890.1 |
| 2015/0109657 A1 | 4/2015 | Baumberg et al. | |
| 2015/0205126 A1 | 7/2015 | Schowengerdt | |
| 2015/0241698 A1 | 8/2015 | Schowengerdt | |
| 2015/0259493 A1 | 9/2015 | Nederkoorn et al. | |
| 2015/0315012 A1 | 11/2015 | Wiersma et al. | |
| 2016/0036353 A1 | 2/2016 | Stasik et al. | |
| 2016/0103341 A1 | 4/2016 | Long et al. | |
| 2016/0187985 A1 | 6/2016 | Lim et al. | |
| 2016/0283773 A1 | 9/2016 | Popovich et al. | |
| 2017/0023807 A1 | 1/2017 | Chang-Hasnain et al. | |
| 2017/0031078 A1 | 2/2017 | Thompson et al. | |
| 2017/0090570 A1 | 3/2017 | Rain et al. | |
| 2017/0192595 A1 | 7/2017 | Choi et al. | |
| 2017/0285348 A1 | 10/2017 | Ayres et al. | |
| 2017/0365630 A1 | 12/2017 | Yang | |
| 2018/0093456 A1 | 4/2018 | Van Overmeere et al. | |
| 2018/0164627 A1 | 6/2018 | Oh | |
| 2018/0175746 A1* | 6/2018 | Van Den Ende | H01L 41/042 |
| 2018/0356303 A1 | 12/2018 | Li et al. | |
| 2019/0296218 A1 | 9/2019 | Ouderkirk et al. | |
| 2019/0361318 A1 | 11/2019 | Johnson et al. | |
| 2020/0076328 A1 | 3/2020 | Cha et al. | |
| 2020/0183168 A1 | 6/2020 | Spann et al. | |
| 2020/0183199 A1 | 6/2020 | Diest et al. | |
| 2020/0183200 A1 | 6/2020 | Diest et al. | |
| 2020/0185590 A1 | 6/2020 | Malhotra et al. | |
| 2022/0199894 A1* | 6/2022 | Park | H01L 41/0471 |

FOREIGN PATENT DOCUMENTS

| | | | | |
|---|---|---|---|---|
| CN | 101672949 A | | 3/2010 | |
| CN | 102712140 A | | 10/2012 | |
| CN | 102713702 A | | 10/2012 | |
| CN | 103168259 A | | 6/2013 | |
| CN | 103502855 A | | 1/2014 | |
| EP | 0807459 A1 | | 11/1997 | |
| KR | 20080091455 A | * | 10/2008 | F03G 7/005 |
| KR | 102396790 B1 | * | 6/2017 | D06N 3/0006 |
| WO | WO-02063073 A1 | * | 8/2002 | C09K 9/02 |
| WO | WO-2005062396 A1 | * | 7/2005 | F02M 51/0603 |
| WO | WO-2008094196 A2 | * | 8/2008 | A61M 5/142 |
| WO | 2011088161 A1 | | 7/2011 | |
| WO | WO-2012083174 A2 | * | 6/2012 | F03G 7/005 |
| WO | 2012116199 A1 | | 8/2012 | |
| WO | WO-2014069477 A1 | * | 5/2014 | D06N 3/0006 |
| WO | WO-2015023803 A1 | * | 2/2015 | H01L 41/0986 |
| WO | 2018000744 A1 | | 1/2018 | |

OTHER PUBLICATIONS

Shen J., et al., "Simple Cubic Three-Dimensional Auxetic Metamaterials," Physica Status Solidi (B), Jul. 17, 2014, vol. 251 (8), pp. 1515-1522.

Notice of Allowance received for U.S. Appl. No. 16/703,291 dated Jun. 3, 2021, 61 pages.

Final Office Action received for U.S. Appl. No. 16/262,433 dated May 25, 2021, 30 pages.

Wilson et al., "Variable Wave Plate via Tunable Form-Birefringent Structures", Journal of Microelectromechanical Systems, vol. 17, No. 4, Aug. 2008, pp. 1039-1046.

International Preliminary Report on Patentability received for PCT Application Serial No. PCT/US2019/064395 dated Jun. 24, 2021, 10 pages.

International Preliminary Report on Patentability received for PCT Application Serial No. PCT/US2019/064367 dated Jun. 24, 2021, 10 pages.

Preinterview first office action received for U.S. Appl. No. 16/262,433 dated Oct. 26, 2020, 58 pages.

Preinterview first office action received for U.S. Appl. No. 16/262,439 dated Nov. 30, 2020, 42 pages.

Final office action received for U.S. Appl. No. 16/351,477 dated Dec. 1, 2020, 38 pages.

Preinterview first office action received for U.S. Appl. No. 16/263,829 dated Dec. 22, 2020, 36 pages.

Non-Final office action received for U.S. Appl. No. 16/449,964 dated Nov. 24, 2020, 91 pages.

Holda et al., "Understanding and guiding the phase inversion process for synthesis of solvent resistant nanofiltration membranes", J. Appl. Polym. Sci. 42130, 2015, 17 pages.

Struzynska-Piron et al., "Synthesis of solvent stable polymeric membranes via UV depth-curing", Chem. Commun., vol. 49, 11494, 2013, 3 pages.

(56) References Cited

OTHER PUBLICATIONS

Mullin et al., "Pattern Transformation Triggered by Deformation", Physical Review Letters, vol. 99, No. 8, 084301, Aug. 22, 2007, 4 pages.
Babaee et al., "3D Soft Metamaterials with Negative Poisson's Ratio", Advanced Materials, vol. 25, No. 36, Jul. 22, 2013, pp. 5044-5049.
Bertoldi et al., "Negative Poisson's Ratio Behavior Induced by an Elastic Instability", Advanced Materials, vol. 22, No. 3, Jan. 13, 2010, pp. 361-366.
Overvelde et al., "Relating pore shape to the non-linear response of periodic elastomeric structures", Journal of the Mechanics and Physics of Solids, vol. 64, Mar. 2014, pp. 351-366.
Ren et al., "Design and characterisation of a tuneable 3D buckling-induced auxetic metamaterial", Materials & Design, vol. 139, Feb. 5, 2018, pp. 336-342.
Correa et al., "Negative stiffness honeycombs for reoverable shock isolation", Rapid Prototyping Journal, vol. 21, No. 2, Mar. 16, 2015, pp. 193-200.
Coulais et al., "Discontinuous Buckling of Wide Beams and Metabeams", Physical Review Letters, vol. 115, No. 4, Jul. 21, 2015, 7 pages.
Bickel et al., "Design and Fabrication of Materials with Desired Deformation Behavior", ACM Transactions on Graphics, vol. 29, No. 4, Article 63, Jul. 1, 2010, pp. 1-10.
Rosset et al., "Small, fast, and tough: Shrinking down integrated elastomer transducers", Applied Physics Review, vol. 3, No. 3, Article 031105, Sep. 26, 2016, pp. 1-20.
Plante et al., "Large scale failure modes of dielectric elastomer actuators", International Journal of Solids and Structures, vol. 43, Mar. 29, 2006, pp. 7727-7751.
Optotune, "Electroactive Polymers", URL: https://optotune.com/technology/electroactive-polymers, retrieved on Apr. 30, 2020, 3 pages.
Novasentis, "Haptic Actuators", URL: https://novasentis.com/product, retrieved on Apr. 30, 2020, 4 pages.
Rosset et al., "Mechanical characterization of a dielectric elastomer microactuator with ion-implanted electrodes", Sensors and Actuators, A, vol. 144, No. 1, Jan. 14, 2008, pp. 185-193.
Gerratt et al., "Dielectric breakdown of PDMS thin films", Journal of Micromech and Microengineering, Technical Note, vol. 23, No. 6, Article 067001, Apr. 26, 2013, pp. 1-7.
Hunt et al., "A self-healing dielectric elastomer actuator", Applied Physics Letters, vol. 104, Article 113701, Mar. 19, 2014, pp. 1-3.
Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.
Mazurek et al., "Glycerol as high-permittivity liquid filler in dielectric silicone elastomer", Journal of Applied Polymer Science, vol. 133, No. 43, Article 44153, Jul. 20, 2016, pp. 1-8.
Rao et al., "Synthesis of flexible silica aerogels using methyltrimethoxysilane (MTMS) precursor", Journal of Colloid and Interface Science, vol. 300, No. 1, Aug. 1, 2006, pp. 279-285.
Seo et al., "Reticulated Nanoporous Polymers by Controlled Polymerization-Induced Microphase Separation", Science, vol. 336, Jun. 15, 2012, pp. 1422-1425.
Jennings, S.G., "The Mean Free Path In Air", J. Aerosol Sci., vol. 19, No. 2, Apr. 2, 1988, pp. 159-166.
Gupta et al., "Nanoemulsions: Formation, Properties, and Applications", Soft Matter, vol. 12, No. 11, Feb. 23, 2016, pp. 1-17.
Helgeson et al., "Mesoporous organohydrogels from thermogelling photocrosslinkable nanoemulsions", Nature Materials, vol. 11, Feb. 12, 2012, pp. 1-9.
Guha et al., "Creating nanoscale emulsions using condensation", Nature Communications, vol. 8, Article 1371, Nov. 8, 2017, pp. 1-7.
Meier et al., "Microemulsion elastomers", Colloid and Polymer Science, vol. 274, Mar. 1, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethoxysilane-based Silica Aerogels by Two-step Sol-gel Process", J. Microelectron. and Packaging Soc., vol. 23, No. 1, Mar. 30, 2016, pp. 35-39.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating $Al_2O_3$ and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Wu et al., "3D Printed Silicones with Shape Memory", Scientific Reports, vol. 7, Article 4664, Jul. 5, 2017, pp. 1-6.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. El-15, No. 3, Jun. 1980, pp. 206-224.
Notice of Allowance received for U.S. Appl. No. 16/262,439 dated Apr. 6, 2021, 38 pages.
Notice of Allowance received for U.S. Appl. No. 16/351,477 dated Mar. 29, 2021, 28 pages.
Non-Final Office Action received for U.S. Appl. No. 16/351,477 dated Jun. 23, 2020, 27 pages.
Fratzl et al., "The mechanics of tessellations—bioinspired strategies for fracture resistance", Chem Soc Rev., vol. 45, No. 2, Jan. 21, 2016, pp. 252-267.
Gohtani et al., "Nano-Emulsions; Emulsification Using Low Energy Methods", Japan Journal of Food Engineering, vol. 15, No. 3, Sep. 1, 2014, pp. 119-130.
Michler et al., "The physics and micro-mechanics of nano-voids and nano-particles in polymer combinations", ScienceDirect, Polymer, vol. 54, No. 13, Jun. 7, 2013, pp. 1-14.
Zhu et al., "Large deformation and electromechanical instability of a dielectric elastomer tube actuator", Journal of Applied Physics, vol. 108, Issue 7, Article 074113, Oct. 13, 2010, pp. 1-6.

(56) References Cited

OTHER PUBLICATIONS

Cameron et al., "Linear actuation in coextruded dielectric elastomer tubes", ScienceDirect, Sensors and Actuators A: Physical, vol. 147, Issue 1, Sep. 15, 2008, pp. 286-291.
Catmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.
Non-Final Office Action received for U.S. Appl. No. 16/364,977 dated Oct. 19, 2020, 38 pages.
Moore, Duncan T., "Gradient Index Optics", Optical Elements, IVPV Handbook of Optics, 2nd Edition, vol. II—Devices, Measurements, and Properties, 1995, pp. 9.1-9.10.
Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.
Shatz, Narkis, "Gradient-Index Optics", Science Applications International Corp., Final Report, Mar. 31, 2010, 103 pages.
Teichman et al., "Gradient Index Optics at DARPA", Institute for Defense Analyses, IDA Document D-5027, Nov. 2013, 69 pages.
Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.
Matyka et al., "How to Calculate Tortuosity Easily?", AIP Conference Proceedings, Mar. 26, 2012, 6 pages.
Cheng et al., "Controlled in Situ Nanocavitation in Polymeric Materials", Advanced Materials, vol. 23, Jan. 2011, pp. 409-413.
Solans et al., "Nano-emulsions: Formation by low-energy methods", Colloid & Interface Science, vol. 17, Issue 5, Oct. 2012, pp. 246-254.
Fuse et al., "Possible Mechanism of Superior Partial-Discharge Resistance of Polyamide Nanocomposites", Annual Report Conference on Electrical Insulation and Dielectric Phenomena, 2004, pp. 322-325.
Johnson et al., "A brief review of atomic layer deposition:from fundamentals to applications", Materials Today, vol. 17, No. 5, Jun. 2014, pp. 236-246.
Sole et al., "Nano-emulsions prepared by the phase inversion composition method: Preparation variables and scale up", Journal of Colloid and Interface Science, vol. 344, 2010, pp. 417-423.
Camino et al., "Polydimethylsiloxane thermal degradation Part 1. Kinetic aspects", Polymer, vol. 42, 2001, pp. 2395-2402.
Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.
Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Waldem et al., "Digilens Switchable Bragg grating waveguide optics for augmented reality applications", Proc. SPIE 10676, Digital optics for Immersive Displays, May 21, 2018, 1 page.
Diest et al., "Nanovoided Tunable Optics", U.S. Appl. No. 16/262,439, filed Jan. 30, 2019, 57 pages.
Ouderkirk et al., "Nanovoided Graded-Index Optical Elements, Optical Arrays, and Methods of Forming the Same", U.S. Appl. No. 16/426,737, filed May 30, 2019, 113 pages.
Diest et al., "Polymer Materials Including Coated Nanovoids and Methods and Systems for Forming the Same", U.S. Appl. No. 16/512,335, filed Jul. 15, 2019, 133 pages.
Sharma et al., "Switchable Electroactive Devices for Head-Mounted Displays", U.S. Appl. No. 16/351,477, filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
Diest et al., "Nanovoided Tunable Birefringence", U.S. Appl. No. 16/262,433, filed Jan. 30, 2019, 51 pages.
Landig et al., "Fabrication of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable Bragg Gratings", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.
International Search Report and Written Opinion received for PCT Application Serial No. PCT/US2019/064367 dated Mar. 11, 2020, 17 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
U.S. Appl. No. 16/262,439, filed Jan. 30, 2019.
Office Action dated Oct. 11, 2022 for Chinese Application No. 201980082159.3, filed Jun. 11, 2021, 12 pages.
Office Action dated Oct. 11, 2022 for Chinese Application No. 201980082380.9, filed Jun. 11, 2021, 17 pages.

* cited by examiner

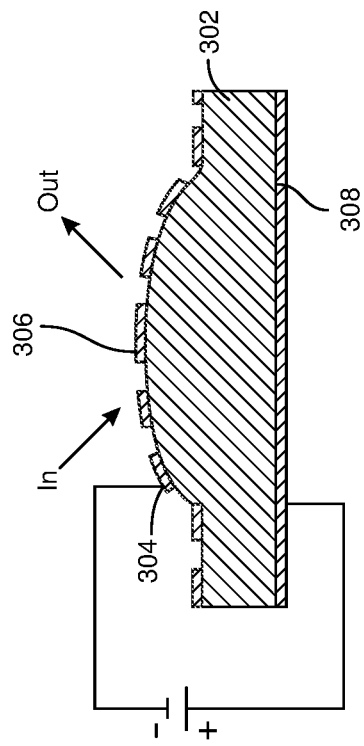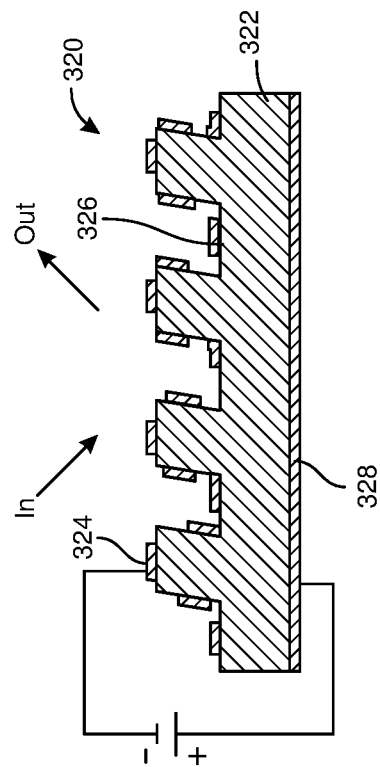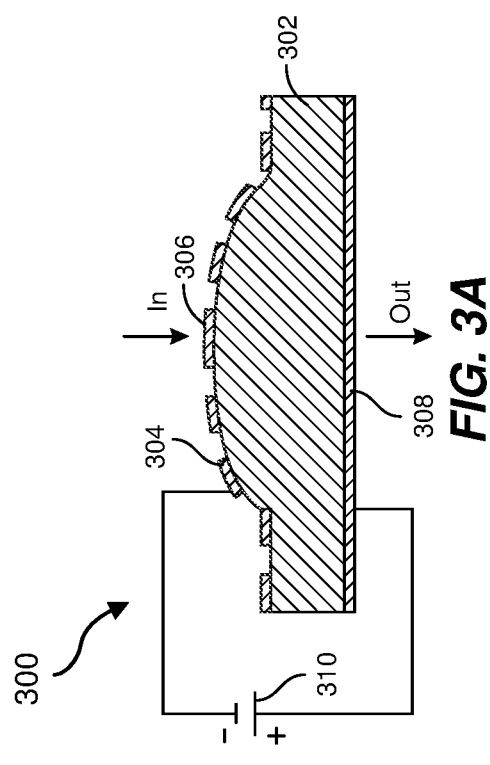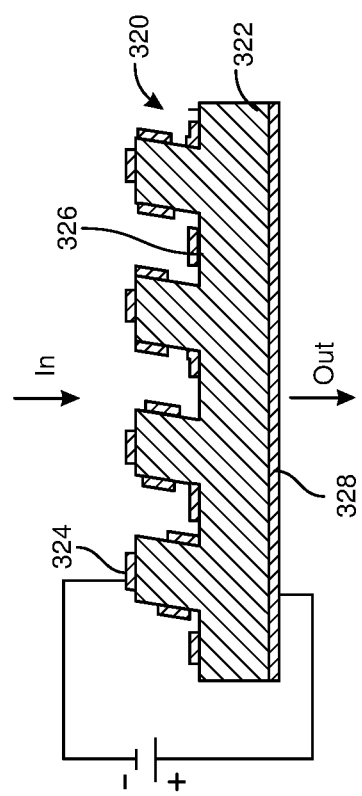
FIG. 3A
FIG. 3B
FIG. 3C
FIG. 3D

SPATIALLY ADDRESSABLE NANOVOIDED POLYMERS

CROSS REFERENCE TO RELATED APPLICATION

This application claims the benefit of U.S. Provisional Application No. 62/777,825, filed Dec. 11, 2018, the disclosure of which is incorporated, in its entirety, by this reference.

BACKGROUND

Polymer materials may be incorporated into a variety of different applications. Electroactive polymer (EAP) materials, for instance, may change their shape under the influence of an electric field.

Improved materials would be useful for, for example, emerging technologies, including virtual reality/augmented reality devices where a comfortable, adjustable form factor is desired.

SUMMARY

As will be described in greater detail below, examples of the instant disclosure include electroactive devices, such as actuators, sensors, and optical elements, having, for example, improved electrical and/or mechanical properties, such as improved electrical control of actuation and/or improved spatial resolution of sensing.

In some examples, a device includes a nanovoided polymer element having a first surface and a second surface, a first plurality of electrodes disposed on the first surface, a second electrode disposed on the second surface (which may be one of a second plurality of electrodes), and a control circuit configured to apply an electrical potential between one or more of the first plurality of electrodes and the second electrode to induce a physical deformation of the nanovoided polymer element. The control circuit may be further configured to determine the physical deformation of the nanovoided polymer element by determining a physical parameter, such as an electrical parameter, such as a capacitance measurement between one or more of the first plurality of electrodes and the second electrode. In some examples, the device includes a second plurality of electrodes disposed on the second surface, where the second plurality of electrodes includes the second electrode. The device may be a spatially addressable actuator, and may also function as a sensor, for example, for physical deformation (such as a touch sensor). The physical deformation of an actuator may include a spatially varying compression of the nanovoided polymer element, and/or a time-varying deformation. A device may be a haptic device, configured to provide haptic feedback to a person, for example, as part of an augmented reality and/or virtual reality device.

A nanovoided polymer element may include a polymer having a plurality of nanovoids disposed therein. A nanovoided polymer element may be flexible, and in some examples may be generally transparent. The polymer may include an acrylate polymer, a silicone polymer, or other polymer. In some the examples, the first plurality of electrodes is generally transparent or generally reflective, and in some examples the second plurality of electrodes (or second electrode) is generally transparent or generally reflective. The device may be an optically transmissive, reflective, or diffractive device, or may have some combination of electrically controllable physical properties (such as optical and/or electrical properties). For example, the physical deformation of the nanovoided polymer element may induces a spatially varying refractive index of the nanovoided polymer element, or a spatially varying reflectivity or diffraction.

In some examples, the device includes an electrically controllable optical element, such as one or more of a mirror, a lens, a prism, a grating, a phase plate, a diffuser, a holographic element, a beam splitter, a beam combiner, or an optical filter. For example, the electrically controllable optical element may include a mirror, and the physical deformation of the nanovoided polymer element induces a spatially varying deformation of the mirror.

In some examples, a device includes a nanovoided polymer element, a first electrode, a second electrode where the nanovoided polymer element is located at least in part between the first electrode and the second electrode, and a control circuit, where the control circuit is configured to apply an electrical potential between the first electrode and the second electrode to induce a physical deformation of the nanovoided polymer element, and determine an electrical capacitance between the first electrode and the second electrode to determine a deformation parameter of the physical deformation. The device may include an electrically controllable optical element, such as a mirror, a lens, a prism, a grating, a phase plate, a diffuser, a holographic element, a beam splitter, a beam combiner, or an optical filter. The physical deformation of the nanovoided polymer element may induce a spatially varying deformation of the optical element.

In some examples, a method includes applying electrical signals to a plurality of electrodes of an electroactive device comprising a nanovoided polymer element to obtain a surface deformation of the electroactive device, and optionally including determining a capacitance between one or more pairs of electrodes within the plurality of electrodes to determine an actual surface deformation of the electroactive device.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIGS. 3A-3D depict exemplary optical elements in accordance with some embodiments.

Figure 1A:
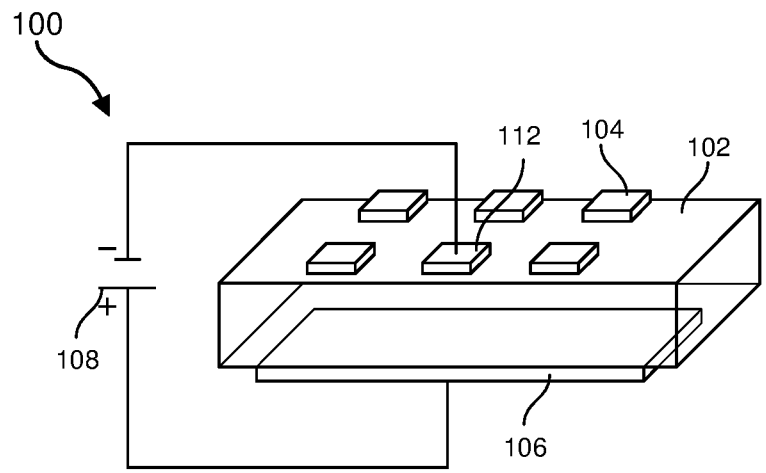
FIGS. 1A-1F depict exemplary NVP elements having electrodes disposed thereon in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing, and/or energy harvesting. Lightweight and conformable, electroactive polymers may be incorporated into wearable devices (such as haptic devices) and are attractive candidates for emerging technologies, including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. Notwithstanding recent developments, there is a need for improved actuators, sensors, and optical elements, along with associated methods, for example, for applications in AR and VR devices.

Figure 11:
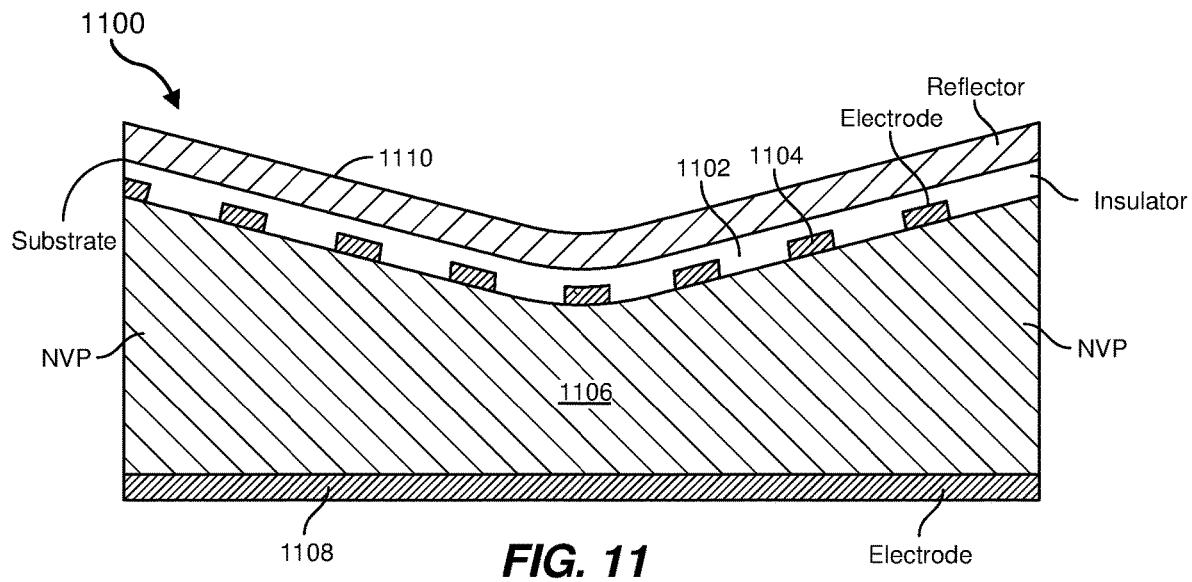
FIG. 11 depicts an exemplary electrically adjustable mirror in accordance with some embodiments.
Figure 12:
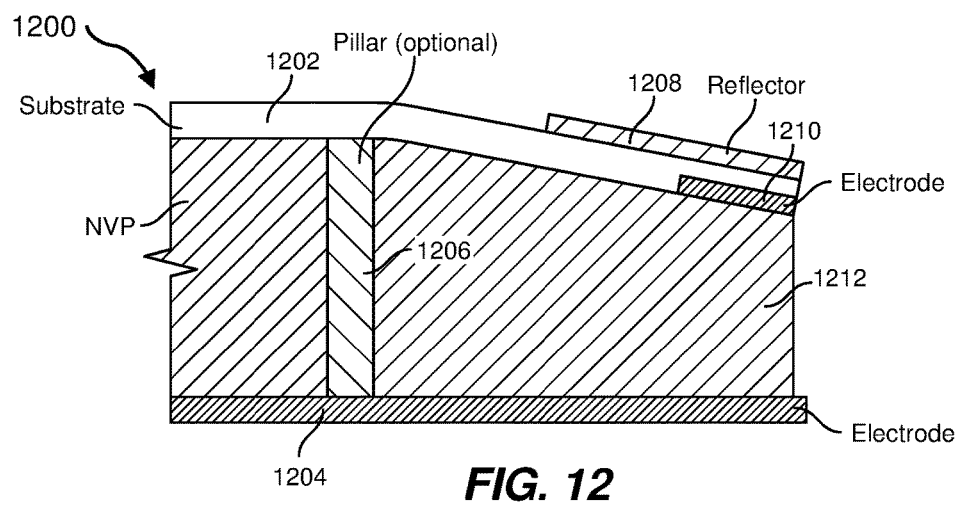
FIG. 12 depicts an exemplary electrically adjustable mirror (e.g., a beam deflector) in accordance with some embodiments.

The present disclosure is generally directed to apparatuses, methods, and systems including electroactive materials, such as nanovoided polymer (NVP) elements having segmented electrodes on one or both sides. As will be explained in greater detail below, embodiments of the present disclosure may include electroactive devices, such as actuators, sensors, and optical elements, having for example, improved electrical control of actuation and/or improved spatial resolution of sensing. In examples described in more detail below, FIGS. 1A-1F depict exemplary NVP elements having electrodes disposed thereon, FIGS. 2A-2D disclose exemplary actuators, FIGS. 3 and 11-12 depict exemplary optical elements, FIGS. 4-10 depict various exemplary actuators and/or sensors, FIGS. 13-14 disclose exemplary methods, and FIGS. 15-20 depict exemplary augmented reality (AR) and/or virtual reality (VR) applications.

As will be explained in greater detail below, in one example a device according to the present disclosure may include a nanovoided polymer element having a first surface and a second surface, a first plurality of electrodes disposed on the first surface, a second plurality of electrodes disposed on the second surface, and a control circuit configured to apply an electrical potential between one or more of the first plurality of electrodes and one or more of the second plurality of electrodes to induce a physical deformation of the nanovoided polymer element. In some examples, the device includes a nanovoided polymer (NVP) element, a first electrode, and a second electrode, wherein the nanovoided polymer element is located at least in part between the first electrode and the second electrode. The device may be a spatially addressable electroactive device, such as an actuator or a sensor. The device may further include a control circuit that is configured to apply an electrical potential between the first electrode and the second electrode and/or to determine a physical deformation between the first electrode and the second electrode, for example, based on a capacitance measurement between electrodes. The control circuit may be further configured to determine the physical deformation of the nanovoided polymer element using a capacitance measurement between one or more of the first plurality of electrodes and one or more of the second plurality of electrodes. The device may be an actuator, such as a spatially addressable actuator. The physical deformation may include a spatially varying compression and/or expansion of the nanovoided polymer element. The nanovoided polymer element may include a polymer having a plurality of nanovoids disposed therein. In some examples, the device may be located on a substrate, which may be a fabric substrate, such as a glove component. The nanovoided polymer element may be flexible, and may be conformed to an underlying non-planar substrate. The nanovoided polymer element may include one or more polymer components, such as an acrylate polymer or a silicone polymer.

In some examples, the nanovoided polymer may be generally transparent, the first plurality of electrodes may be generally transparent or generally reflective, and the second plurality of electrode may be generally transparent or generally reflective. The physical deformation of the nanovoided polymer element may induce a spatially varying refractive index of the nanovoided polymer element, for example, a refractive index that has a position-dependent value across the NVP element.

The above-described device may also include an electrically controllable optical element, for example, one or more of a mirror, a lens, a prism, a grating, a phase plate, a diffuser, a holographic element, a beam splitter, a beam combiner, or an optical filter. For example, application of a spatially (e.g., periodically) varying electric field may induce a spatially (e.g., periodically) varying parameter, such as a refractive index, surface displacement, or the like. For example, the optical element may include a mirror, and the physical deformation of the nanovoided polymer element may induce a spatially varying deformation of the mirror. The mirror may include a reflective film, such as a metal film, deposited onto the NVP element. A film may be both electrically conductive and reflective, and be used as both an electrode (or pattern or electrodes) and a mirror.

In some examples, the device may include a nanovoided polymer element, a first electrode, a second electrode (where the nanovoided polymer element is located at least in part between the first electrode and the second electrode), and a control circuit configured to apply an electrical potential between the first electrode and the second electrode to induce a physical deformation of the nanovoided polymer element, and/or to measure an electrical capacitance (or other electrical parameter) between the first electrode and the second electrode to determine a parameter of the physical deformation, such as a degree of deformation (e.g., expressed as a distance from a non-deformed position). The device may also include an electrically controllable optical element, such as one or more of a mirror, a lens, a prism, a grating, a phase plate, a diffuser, a holographic element, a beam splitter, a beam combiner, or an optical filter.

In addition, the device may include an actuator controlled by an electrical potential between the first electrode and the second electrode, and a sensor responsive to, for example, a capacitance between the first electrode and the second electrode. In some examples, the optical element includes a mirror, and the physical deformation of the nanovoided polymer element induces a spatially varying deformation of the mirror. In some examples, a method, for example, performed by a device as described herein, may include applying electrical signals to a plurality of electrodes of an electroactive device comprising a nanovoided polymer element to obtain a surface deformation of the electroactive device. The method may further include determining a capacitance between one or more pairs of electrodes within the plurality of electrodes to determine an actual deformation of an electroactive device. In some examples, the determination of the actual deformation may be used to calibrate electrical signals applied to obtain a desired deformation. In some examples, the surface deformation is induced within a haptic device.

Features from any of the embodiments described herein may be used in combination with one another in accordance with the general principles described herein. These and other embodiments, features, and advantages will be more fully understood upon reading the following detailed description in conjunction with the accompanying drawings and claims.

An example nanovoided polymer (NVP) element may have segmented electrodes on one or both sides, and electrical signals applied to these electrodes may allow three-dimensional (3D) conformation changes of the NVP element. Examples include actuators, for example, having electrically-controllable compression, curvature, pressure on skin, texture, or other haptic function. Devices may be stacked to increase actuation. Examples include sensors responsive to, e.g., pressure (e.g., touch, acoustic signals), temperature, and the like. A sensor circuit may determine capacitance changes. Sensors may be curved or otherwise conformal to an underlying substrate. Examples also include optical elements, such as gratings, holographic elements, mirrors, and the like. Electrodes may be transmissive or reflective. A device with reflective top electrodes may be an electrically controllable mirror and may be used for field correction of a projection display. In some examples, electrodes may be stretchable or have a fish-scale structure allowing increased bending. An example device may function both as an actuator and a touch sensor, and may also be optically transparent.

Typically, electroactive polymers are used for actuation and sensing with a limited number of electrodes to obtain a uniform conformational response across the entire device. However, for applications involving touch sensors or deformable optical elements, precise segmental actuation and sensing ability may be desirable.

In some examples, a spatially addressable electroactive device may include: a nanovoided polymer (NVP) element having a first and second surface; a first electrode on the first surface of the nanovoided polymer element; and a second electrode on the second surface of the nanovoided polymer element. In these examples, the first and/or second electrodes may be segmented, and the application of electrical signals to the segmental electrodes may allow 3-dimensional conformational changes of the nanovoided polymer element.

In some examples, a spatially addressable electroactive device, such as an actuator, may include: a nanovoided polymer element having a first and second surface; a first electrode on the first surface of the nanovoided polymer element; and a second electrode on the second surface of the nanovoided polymer element. In these examples, one or both of the electrodes may be segmented, and the device may be actuated by applying different voltages at different segmental electrode pairs, resulting in a spatially varying compression or expansion in the nanovoided polymer.

In some examples, a spatially addressable electroactive polymer element, such as an optical element (e.g., a transmissive or reflective optical element) may include: a nanovoided polymer element having a first and second surface; a first electrode on the first surface of the nanovoided polymer element; and a second electrode on the second surface of the nanovoided polymer element. In these examples, one or both of the electrodes may be segmented, one or both of the electrodes may be transparent, and the optical element may change its refractive index in response to the expansion or compression caused by the segmental electrical voltages. In some examples, a voltage distribution applied to the segmented electrode pairs may create a 3D conformational change in the optical element to impart a desired optical response.

In some examples, an optical element, such as, for example, a reflective optical element including a spatially addressable electroactive polymer, may include: a nanovoided polymer element having a first and second surface; a first electrode on the first surface of the nanovoided polymer element; and a second electrode on the second surface of the nanovoided polymer element. In these examples, one or both of the electrodes may be segmented, the first electrode may be transparent, and the second electrode is reflective. The optical element may change its refractive index in response to an expansion or compression caused by the segmental electrical voltages. In some examples, expansion or compression may also be caused using mechanical inputs such as pressure, acoustic waves, ultrasound, conformation changes, or other displacements, for example, allowing sensor applications. A voltage distribution applied on the segmental electrode pairs may create a 3D conformational change in the optical element to impart a desired optical response.

An optical reflector including a spatially addressable electroactive polymer may include: a nanovoided polymer element having a first and second surface; a first electrode on the first surface of the nanovoided polymer element; and a second electrode on the second surface of the nanovoided polymer element. In this example, one or both of the electrodes may be segmented and the first electrode may be reflective with a reflectivity of greater than a percentage reflectivity, such as a reflectivity of at least approximately 85%, for example, at one or more visible wavelengths. A voltage distribution applied on the segmental electrode pairs may create a 3D conformational change in the reflector.

A sensor, including a spatially addressable electroactive device, may include: a nanovoided polymer element having a first and second surface; a first electrode on the first surface of the nanovoided polymer element; and a second electrode on the second surface of the nanovoided polymer element. In this example, one or both of the electrodes may be segmented, and the device may sense segmental transduction by recording capacitive changes brought about by segmental perturbations.

In some example devices, the separation between electrodes, such as individual electrode array elements, is such that it does not impede with the effective bending of the nanovoided polymer element. This can be achieved by increasing the distance between adjacent electrodes, using flexible electrodes, or fish-scaling the adjacent electrodes. In fish-scaled electrodes, adjacent electrode elements may slide over each other to facilitate bending.

In some example devices, electrodes may be stretchable. In some example devices, an electrode may be disposed on a substrate, which may be a flexible and/or stretchable substrate.

In some example devices, an electrode (such as the first electrode in the examples above) may be segmented, and the second electrode may be a plane common ground. In some examples, a segmented electrode may include an array of electrical conductors of a pre-defined shape arranged in a pre-defined pattern, such as on a line (1×N), a rectangular grid (N×M, where N or M is the number of elements in the array), or a non-rectangular grid, such as elements on a curve, spiral pattern, or other form. In some examples, both the first and second electrodes are segmented, and each individual array element of the first electrode may be aligned on top of (i.e., opposite) a corresponding individual array element of the second electrode. In some examples, both the first and second electrodes are segmented, and the array elements of the first electrode are laterally shifted with respect to the array elements of the second electrode. In some examples, a signal may be applied to alternating segments of the first electrode, and the second electrode may be the common ground. In some examples, the voltages applied to the first and second electrodes have the same or opposite polarity. In some examples, the nanovoided polymer has uniform, non-uniform, or a pre-determined distribution and size of voids within the polymer.

In some examples, a device may be spatially addressable and may provide the ability to apply and/or read different signals at different spatial locations on the device. In some examples, multiplexing schemes can be used to apply electrical signals. In some examples, electrode pairs may be provided by the intersection of electrode stripes on each side of the NVP, for example, between orthogonal electrode stripes. Electrode stripes may also have a curved, wiggly, squiggly, or wavy shape, including lateral displacements of an electrode track in the plane of the electrode. Wavy shapes may be periodic (e.g., sinusoidal), and wiggly shapes may have many oscillatory components and may include random or near-random deviations from a straight track. In some examples, wavy or wiggly shapes may be used to reduce visual perception of an electrode. A wiggly electrode may extend across a substrate, though not in a linear path, whereas a squiggly electrode may be somewhat more localized on the substrate.

In some examples, a nanovoided polymer may include an electroactive polymer having a plurality of nanovoids. The nanovoids may have a dimension, such as a diameter, of less than 1 micron. In some examples, any electroactive polymer may be used, with or without nanovoids, for example, having microvoids or no voids.

Figure 1B:
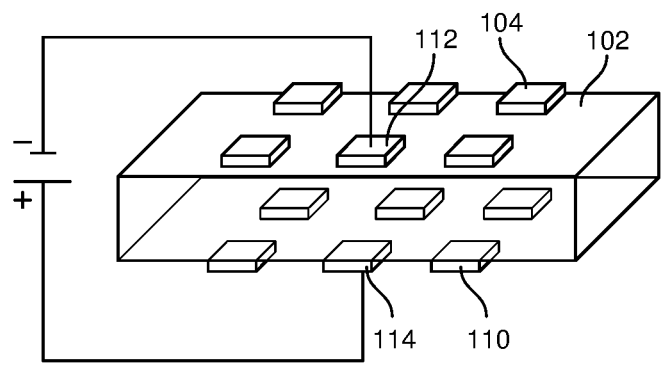
Figure 1C:
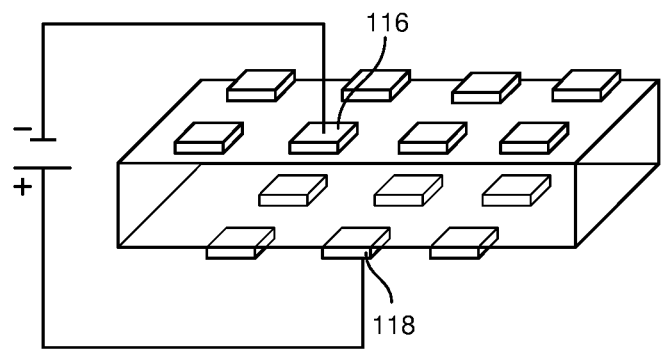
Figure 1D:
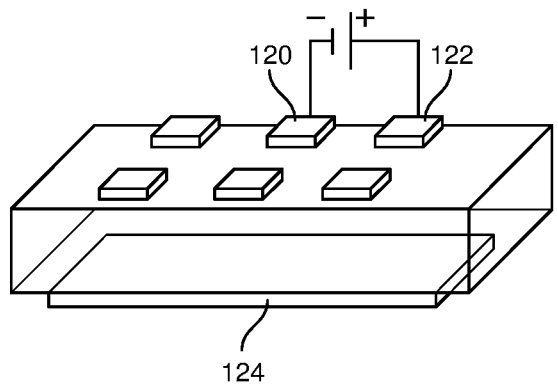
Figure 1E:
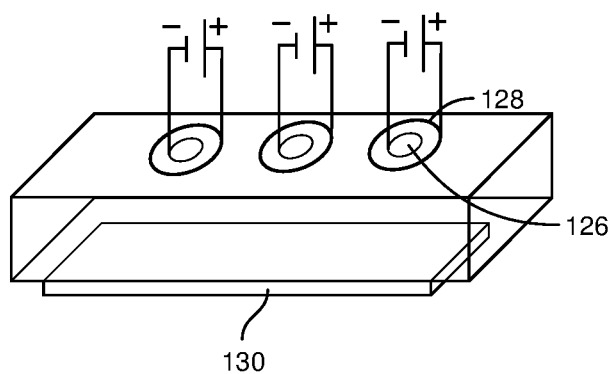
Figure 1F:
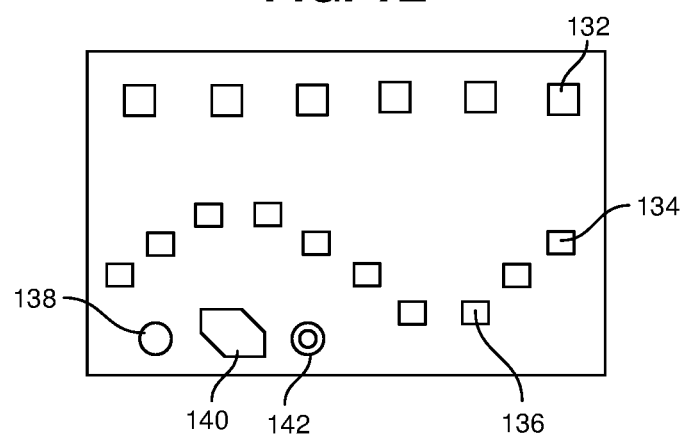

FIGS. 1A-1F show example configurations (e.g., arrangements and shapes) of first and second electrodes on a nanovoided polymer element. In these examples, the NVP element is shown as a rectangular block. The figures will be described in more detail below, but brief descriptions of these figures follow. FIG. 1A shows an arrangement of upper electrodes and a common lower electrode. FIG. 1B shows application of an electric field to opposed electrodes. FIG. 1C shows application of an electric field to laterally offset electrodes, which may provide a lateral component to the electrical field and hence electroactive constriction. In some examples, bending may be obtained. In some examples (e.g., FIG. 1D), lateral fields may be applied. In some examples (e.g., FIG. 1E), radial fields may be applied within the plane of the electrodes. Electrodes may be arranged in any desired arrangement, such as a 1D or 2D array, a sinuous pattern, irregular pattern, and the like, for example, as shown in FIG. 1F. In some cases, an electrode may be elongated, e.g., as a stripe electrode. Electrode stripes may be straight (e.g., a highly elongated rectangular shape), wiggly, or wavy. The figures will now be discussed in more detail.

FIG. 1A shows a device 100 including a nanovoided polymer (NVP) element 102 having a first plurality of electrodes (such as electrodes 104 and 112) on a first surface and a second common electrode 106 on a second surface of the NVP element. The second electrode may act as ground plane electrode for some or all of the first plurality of electrodes. A voltage source 108 allows application of electrical signals between electrodes. For clarity, only electrical connections to electrodes 112 and 106 are shown. In some examples, a control circuit with a plurality of electrical connections may be used to apply electrical signals to some or all of the plurality of electrodes, and/or the common electrode. Applied electrical signals may include alternating voltages and/or direct voltages.

FIG. 1B shows a first plurality of electrodes (such as electrodes 104 and 112) disposed on an NVP element, in a similar manner to that shown in FIG. 1A. In this example, the second surface of the NVP element supports a second plurality of electrodes (such as electrodes 110 and 114). In this example, the first and second pluralities of electrodes (in this case, first and second electrode arrays) are positionally aligned with respect to each other. For example, electrode 112 (of the first plurality of electrodes) is located in positional registration with electrode 114 (of the second plurality of electrodes). An electric field between electrode 112 and electrode 114 will be generally normal to the surfaces of the NVP element on which the electrodes are deposited.

FIG. 1C shows first and second pluralities of electrodes (in this example, electrode arrays) which are laterally shifted with respect to each other. In this example, an electric field between electrode 116 (of the first plurality of electrodes) and electrode 118 (of the second plurality of electrodes) may have a substantial component parallel to the surfaces on which the electrodes are deposited.

FIG. 1D shows a configuration where a voltage is applied between electrodes 120 and 122 that are both within the first plurality of electrodes, for example, between electrodes on the same surface of the NVP element. For example, a voltage may be applied to alternating segments of the first plurality of electrodes. A control circuit may be configured to apply voltages between electrodes within the same plurality of electrodes (as illustrated in FIG. 1D), and/or between an electrode such as 120 and the second electrode 124, in this example a common electrode. In some examples, the second electrode 124 may be omitted. In some examples, a voltage may be applied between electrode 112 and/or electrode 122 and the second electrode 124.

FIG. 1E shows another configuration having generally concentric ring-shaped electrodes 126 and 128 within a plurality of electrodes. The inner electrode 126 may be generally circular, with the outer ring-shaped electrode 128 generally encircling it. A control circuit may be configured to apply voltages between electrodes within the same plurality of electrodes (such as between an electrode and a generally or at least partially surrounding electrode), or between an electrode such as 126 or 128 and the second electrode 130, in this example a common electrode. In some examples, the second electrode 130 may be omitted.

FIG. 1F shows a top view of a plurality of electrodes. FIG. 1F shows the plurality of electrodes including a one-dimensional (1D linear) array of electrodes, such as electrode 132. FIG. 1F also shows an arrangement of electrodes, such as electrodes 134 and 136, which are not disposed in a linear array. Electrodes may be patterned, segmented, arrayed, or disposed in an arbitrary or semi-random manner. FIG. 1F also shows examples of different shapes that may be used as electrodes, for example, in an arrangement or array of electrodes. An arrangement of electrodes may include aspects of some or all of the illustrated examples, such as circular electrode 138, polygonal electrode 140, and ring-shaped electrode 142. In some examples, one or more of a plurality of electrodes may include elongated rectangular electrodes, such as stripe electrodes.

In some examples, an NVP element may have an array of stripe electrodes on one surface, and an orthogonal array of stripe electrodes on the opposite surface. Electrical signals may be applied between opposite portions of the electrodes using a multiplexing approach.

Segmental actuation and/or segmented sensor signals may be determined by the size of the stimulated electrode pair, for example, the area of one or both electrodes, and their separation. Each electrode element may be physically and/or electrically separated from one another to limit electrical cross-talk between neighboring electrode element, such as between pixels of a pixelated electrode array.

Figure 2A:
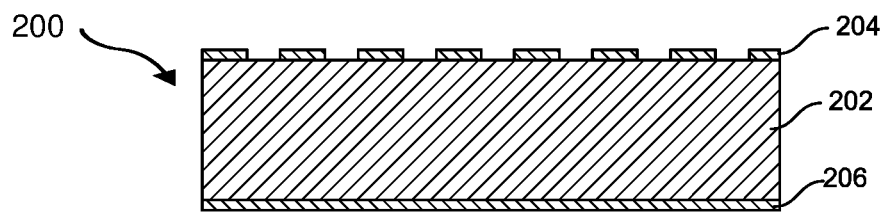
FIGS. 2A-2D depict exemplary actuators in accordance with some embodiments.

FIGS. 2A-2D show cross-sectional views of electrode arrangements and the corresponding actuated states of example electroactive devices. FIG. 2A shows a device 200 including a nanovoided polymer (NVP) element 202, a plurality of electrodes on a first surface of the NVP element, including electrode 204, and a common electrode 206 disposed on a second surface of the NVP element. In some examples, a control circuit may be used to apply variable voltages to one or more of the plurality of electrodes on the upper surface of the NVP element. The figure shows an undeformed structure. In some examples, an NVP element may be formed having an irregular structure, such as having an undulating surface, which may be effectively planarized or otherwise deformed using appropriate electrical signals applied, for example, to electrodes of the plurality of electrodes as a function of position.

Figure 2B:
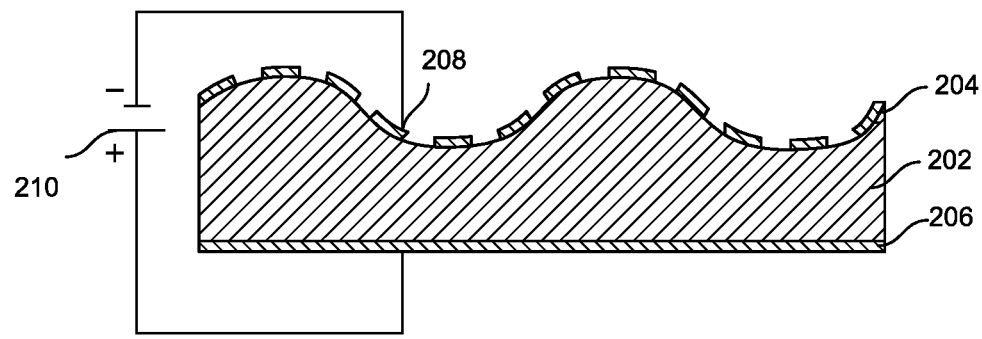

FIG. 2B shows a spatially varying deformation of the NVP element 202 that may be induced by applying different voltages to each of the plurality of electrodes. The figure shows a voltage source 210 that may be used to apply the voltage between one or more electrodes of the plurality of electrodes and the common electrode. For illustrative clarity, only an electrical connection to an electrode 208, of the plurality of electrodes, and common electrode 206 is shown. In some examples, a control circuit with a plurality of electrical connections may be used to apply voltages between, for example, each of the plurality of electrodes (such as electrodes 204 and 208) and the common electrode (206). In some examples, the voltage applied to each of the electrodes of the first plurality of electrodes may have a repeating variation, such as an approximation to a sinusoidal, square-wave, or triangular wave variation. This may be used to obtain, for example, a corresponding periodically repeating deformation of the NVP element. In other examples, the deformation may not have a periodic variation, and may include a non-periodic undulation, concave deformation, convex deformation, parabolic deformation, or other form of repeating or non-repeating spatial variation. Example approaches may be used to obtain electrically-controllable diffractive, reflective, refractive, holographic, or other forms of optical elements.

The degree of deformation (e.g., electrically-induced constriction) between the electrodes may be controlled by adjusting the voltage between one or more of the plurality of electrodes and the common electrode, for example, as a function of the position of the electrodes. In some examples, the upper surface of the NVP element may have an electrically controllable curved surface, which may be used for example, in an electrically-controlled optical element, such as an electrically-controlled lens or mirror. For example, a smooth concave or convex upper surface may be obtained by applying electric signals having a magnitude (e.g., DC voltage, or RMS voltage) that is an appropriate function of position.

In FIGS. 2A-2B, the common electrode 206 may be a rigid electrode, or may be deposited on a rigid substrate. In some examples, the deformation occurs mostly on the first surface (the top surface, as illustrated) and may be controlled, for example, by varying the applied voltage to each electrode as a function of position. The surface deformation may include, for example, one or more of: an undulating structure, a parabolic or other curved structure (e.g., either convex or concave), an oblique structure (e.g., a tilted surface formed by an approximately linear degree of deformation as a function of position), or other structure.

Electrical potentials may be applied between each electrode (or between selected electrodes) of a plurality of electrodes and a common electrode may be used to obtain a desired surface deformation, for example, an undulating pattern, a curved deformation (such as a concave or convex mirror), a tilt, and the like. This approach may be used to generate a desired haptic feedback, texture, or optical property (e.g., a diffraction grating, or spatially variable phase delays, e.g., to create interference fringes). The root mean square (RMS) magnitude and time dependence of applied fields may be varied to obtained desired dynamic (time-varying) properties. For example, the applied electrical signal may be modulated to obtain a tactile sensation. In FIG. 2B, the lower surface of the NVP does not distort, for example, due to a relatively rigid underlying substrate (not shown). In some examples, such as discussed elsewhere, both surfaces of the NVP (and any attached flexible substrates) may distort. In some examples, the thickness of the NVP layer may vary laterally, for example, having alternating relatively narrow and relatively thicker regions. For example, the thickness variation may be oscillatory, tapered, or otherwise varying. In some examples, a sinuous distortion may be obtained. Reflective, refractive, and/or diffractive optical elements may be obtained using this approach.

Figure 2C:
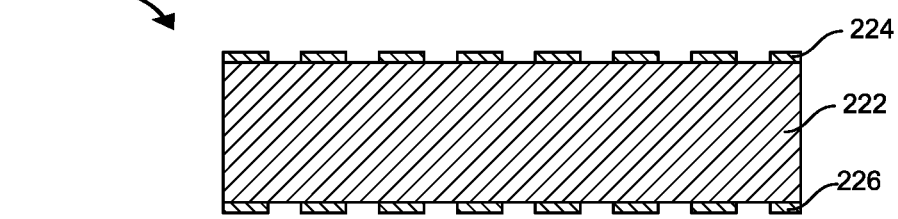

FIG. 2C shows another example configuration, in which each of the first and second opposed surfaces of the NVP element support a plurality of electrodes. The figure shows a device 220 including an NVP element 222 having a first plurality of electrodes (such as electrode 224) on one surface, and a second plurality of electrodes (such as electrode 226) on the second surface.

Figure 2D:
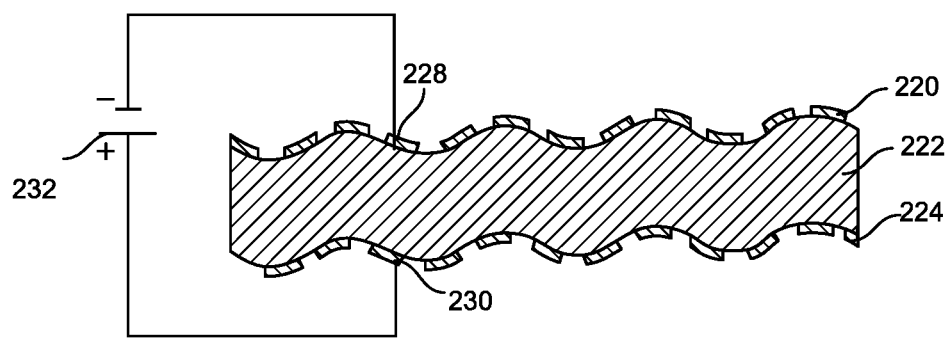

FIG. 2D shows an example deformation of the NVP element 222, which may be achieved using electrical potentials (voltages) between electrodes, such as opposed electrodes (e.g., 228 and 230), adjacent electrodes on the same substrate, or electrodes on opposite surfaces having a lateral offset. FIG. 2D shows a spatially varying deformation of the NVP element that may be induced by applying different voltages between each of the first plurality of electrodes and a corresponding (e.g., opposite) electrode of the second plurality of electrodes. The figure shows a voltage source 232 that may be used to apply a voltage between the electrodes. For clarity, FIG. 2D shows only an electrical connection to a single upper electrode 228 and a single lower electrode 230. In some examples, a control circuit with a plurality of electrical connections may be used to apply voltages between, for example, each of the first plurality of electrodes (such as electrodes 224 and 228) and a corresponding electrode of the second plurality of electrodes (such as electrodes 226 and 230), or other combination of electrodes. In some examples, the thickness of the NVP element may vary with position based on the magnitude of electric signals applied between different pairs of electrodes. In some examples, the NVP may take on an undulating configuration, for example, based in part on voltages applied between laterally offset electrodes on opposed surfaces. In some examples, the deformation of the NVP element may include a spatially varying thickness and a spatially varying undulation.

The degree of deformation (e.g., electrically-induced constriction) between the electrodes may be controlled by adjusting the voltage between one or more of the corresponding pairs of opposite electrodes, for example, as a function of the position of the electrodes. In some examples, the upper surface and/or the lower surface of the NVP element may have an electrically controllable curved surface, which may be used for example, in an electrically-controlled optical element, such as an electrically-controlled lens or mirror.

In some examples, the actuator may be in contact with another flexible and conformal substrate. The actuation can generate a force or displacement of that substrate. It can also generate changes in capacitance, resistance, and optical properties such as refractive index or optical phase of the nanovoided polymer. The nanovoided polymer under individual electrode can be switched using an active matrix backplane or a passive matrix backplane. Flexible backplanes made from organic thin film transistors and stretchable interconnects may also be used. For sensing, the perturbations can be in the form of mechanical or thermal inputs that can be sensed by this sensor.

In some examples, a nanovoided polymer (NVP) element may be used as a transmissive optical element where the actuated state of the device may be a lens or a grating. In some examples, both the first and second electrodes are transparent. In some examples, an optical element may be driven by a transparent active matrix such as transparent nanowire transistor circuitry. In some examples, a device may include a reflective optical element. In such cases, the NVP (or the electrodes) need not be transparent, for example, if the reflective element (e.g., a mirror) is on the outer surface so that light does not pass through the NVP element. In some examples, one electrode may be transparent and/or may be stretchable, and the other electrode may be reflective.

FIGS. 3A-3D show surface deformations on an example spatially addressable nanovoided polymer, which may in some examples be used as optical elements.

FIG. 3A shows a device 300 including an NVP element 302 having a plurality of electrodes (such as electrodes 304 and 306) on a first surface, and a common electrode 308 on a second surface. Only representative electrical connections to electrode 304 and common electrode 308 are shown for clarity. A voltage source 310 may be used to provide electrical signals to some or all electrodes. There may be an electrical connection to some or all electrodes, with the applied electrical signals controlled by a control circuit. A control circuit with a plurality of electrical connections may be used to apply voltages between, for example, each of the first plurality of electrodes (such as electrodes 304 and 306) and the common electrode 308.

The figure illustrates how curved surface deformations can be defined by a plurality of electrodes, each electrode receiving an appropriate electrical signal. The spatial extent of the deformation may be defined by a plurality of electrodes and electrical signals thereon. The arrows labeled "In" and "Out" may refer to a light ray, and the device may be used with an electrically focusable lens, for example, for vision correction. In some examples, an electrical signal applied to a periphery of the lens shape may be greater, giving a larger degree of electro-constriction at the periphery. In some examples, signals of the same polarity may be applied to, for example, an electrode and the common electrode and used to induce electrostatic repulsion between the electrodes, and corresponding expansion of the NVP element. The NVP element and/or the electrodes may be generally transparent, for example, including nanovoids that have a dimension generally less than a wavelength of visible light. For example, the electrodes may be generally transparent, and may for example, include a transparent conductive oxide, such as indium tin oxide (ITO), tin oxide, other metal oxide, or an electrically conductive polymer. NVP pores may be air filled, or in some examples include a fluid with a refractive index similar to that of the polymer, for example, within 0.1 of the polymer refractive index at a visible wavelength. In some examples, an electrically controllable convex or plano-convex lens may be fabricated using this approach. In some examples, a concave or plano-concave lens may be fabricated using this approach.

FIG. 3B shows a similar arrangement as FIG. 3A, except that the arrows "In" and "Out" may refer to reflection of an optical beam. The device may include an NVP element 302, a plurality of electrode such as electrodes 304 and 306, and a common electrode 308. In some examples, the electrodes (such as 304 and 306) may be reflective. The gaps between electrodes may be appreciably less than the width (or other dimension) of the electrodes, so that the upper surface may be mostly reflective. In some examples, a separate reflective layer (not shown) may be included, for example, separated from the electrodes using a dielectric (e.g., plastic) film, and which may be outside of the electrode arrangement. In some examples, a device may function both as a reflective or a transmissive optical device, for example, depending on the wavelength of light and/or desired application.

In other examples, the surface supporting a plurality of electrodes may be located on a rigid substrate, or may be otherwise rigid, and the deformation may occur mostly or substantially entirely on the surface supporting the common electrode. A common electrode may also function as a mirror in reflective optical element applications.

The surface deformation may be used to obtain changes in optical properties, such as reflection, refraction, or diffraction, such as the focal length of a lens or mirror, grating properties, or properties of a holographic element. The electrodes themselves may act as reflectors, and/or a separate reflector layer may be used. The periodicity of the deformation may be determined by the repeat distance of an electrode arrangement. Examples may include transmission gratings or reflection gratings, depending on whether reflective electrodes or transparent electrodes are used. Reflective electrodes may also function as a mirror or a portion thereof. For example, a reflector may include one or more reflective layers that are also used as electrodes.

FIG. 3C shows a device 320 having a plurality of electrodes (such as electrode 324 and electrode 326) located on a first surface of an NVP element 322, and a common electrode 328 located on a second (opposite) surface of the NVP element 322. For clarity, electrical connections to only two electrodes (324 and 328) are shown. In some examples, a control circuit with a plurality of electrical connections may be used to control the electrical signals applied to one or more of a plurality of electrodes to achieve a desired surface profile. In some examples, an electrically-induced compression between an electrode (of the plurality of electrodes) and the common electrode 328 may be used to obtain an undulating surface, for example, by applying electrical signals that vary as a function of electrode position. The undulations in the surface profile (and/or NVP element thickness) may be stepped, as illustrated, or, for example, may include sinusuoidal undulations, other rounded undulations (such as a stepped profile with rounded corners), triangular profiles, and the like. The arrows labelled "In" and "Out" may refer to a light beam passing through the NVP element. In such an example, the NVP element may act as a grating structure, or other diffractive element. In some examples, an electrode such as 326 may receive a larger electrical signal than an electrode such as 324 to achieve a greater local electric field induced compression of the NVP element. In some examples, some electrodes (such as 324) receive no electrical signal, or a potential similar to that of electrode 328, so that little electrical compression is obtained.

FIG. 3D shows a similar arrangement to FIG. 3C, where the arrows labelled "In" and "Out" refer to a light beam reflecting from an NVP element 320, which may in this configuration provide a reflection grating. In some examples, the electrodes such as 324 and 326 may be reflective. The gaps between electrodes may be appreciably less than the width (or other dimension) of the electrodes, so that the upper surface is mostly reflective. In some examples, a separate reflective layer (not shown) may be included.

Figure 4:
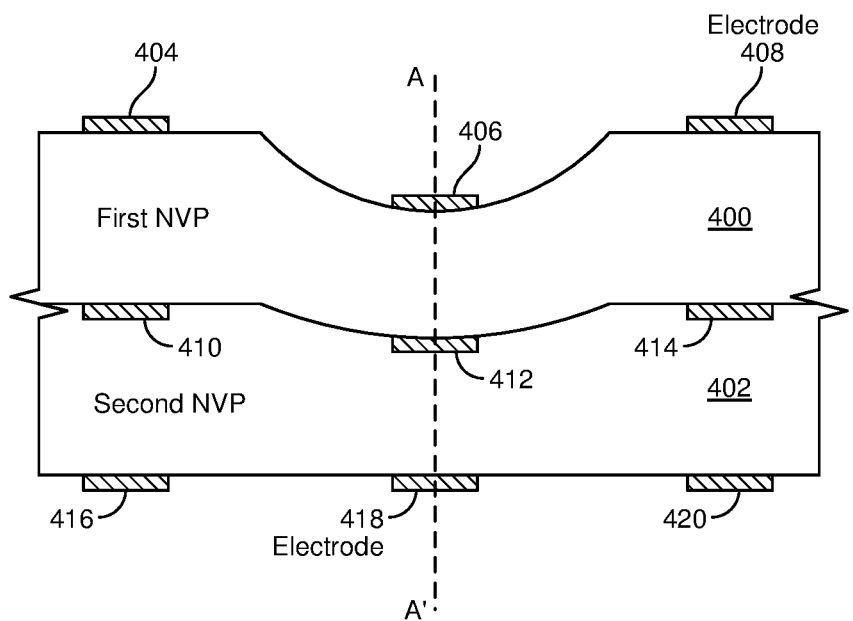
FIG. 4 depicts an exemplary stacked actuator configuration in accordance with some embodiments.

FIG. 4 depicts an exemplary stacked actuator configuration in accordance with some embodiments. The figure depicts a first NVP layer 400 stacked on top of a second NVP layer 402. Voltages applied between electrode 418 and electrode 412, and between electrode 412 and electrode 406, may be used to obtain a cumulative displacement of the top electrode 406 and the NVP layer surface on which it is disposed, which in this example may be a cumulative electro-constriction. In some examples, voltages may not be applied between electrodes 416, 410, and 404, or between electrodes 420, 414, and 408. However, a control circuit (not shown) may be used to apply any desired pattern of electrical signals to any selection of available electrodes to achieve a desired deformation. In some examples, electrodes may be aligned in positional registration along a normal to the device (e.g., A-A'). The number of stacked NVP layers, other layers, and/or electrodes is not limited by this example and may be any number as desired. For example, 3, 4, 5 or some greater number of NVP layers may be stacked to obtain a cumulative deformation in a multilayer that may be (at least approximately) the sum of the deformations of individual NVP layers.

In some examples, an electrical potential between each neighboring pair of electrodes induces a cumulative displacement of the top surface. In some examples, the bottom surface does not deform (e.g., the example of FIG. 4), for example, due to the presence (not illustrated) of a rigid bottom substrate. The arrangement of electrodes in multiple layers may be: aligned on top of each other (e.g., generally in positional registration); laterally displaced with respect to other electrodes (e.g., to allow application of a component of the electric field within the plane of an NVP layer); have any shape as described elsewhere (e.g., wiggly electrodes, or any other shape); or some of the electrodes could be plane common ground or held at a constant voltage and not segmented. In some examples, the middle electrodes may be embedded in a separate middle layer so that these middle electrodes are outside of both NVP layers. A separate middle layer may also be used to adhere or otherwise connect the two NVPs together. In some examples, both outer surfaces may deform inducing curvature of both top and bottom surfaces. NVP layers may be attached to each other, for example, using an adhesive, chemical functionalization of NVP surfaces, mechanical connection, or other approach. An adhesive layer may be one or more of: stretchable, flexible, resilient, or optically transparent. The lateral extent of deformation may be limited by one or more approaches, e.g., physical spacers that fix electrode separation at various locations, increased rigidity at various locations (e.g., using patterned cross-linking, compositional variations, polymer molecular weight variations), spatially patterned nanovoids, other approach, or any combination thereof.

Figure 5:
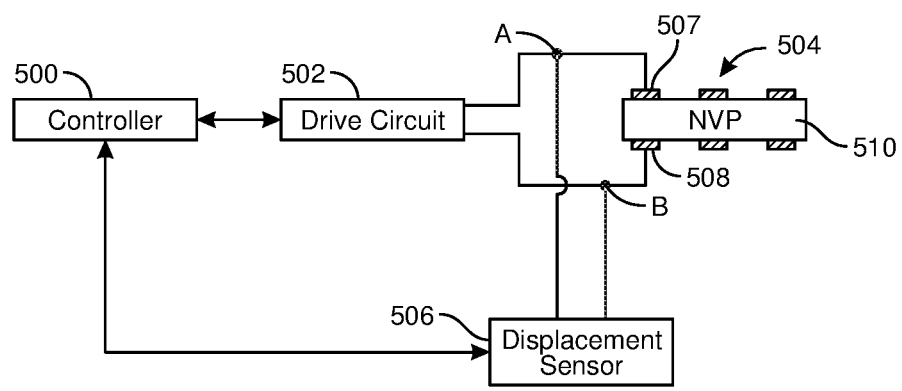
FIG. 5 depicts an exemplary combined actuator/displacement sensor in accordance with some embodiments.

FIG. 5 is a schematic of an exemplary combined actuator/displacement sensor in accordance with some embodiments. In this example, a controller 500 is used to drive (either directly or through a separate drive circuit 502) an actuator 504. The actuator may include an NVP element 510 and electrodes such as electrodes 507 and 508. For clarity, only electrical connections to electrodes 507 and 508 are shown, but any combination of available electrodes may be driven by the drive circuit 502. A displacement sensor 506 may be in electrical communication with the same (or, e.g., proximate) electrodes 507 and 508, in this example through electrical connections labeled "A" and "B", and may be used to determine the displacement (e.g., of the electrodes, relative to each other) due to the electrically driven actuation. The displacement sensor 506 may provide a displacement signal to the controller 500, and this may be used to improve the accuracy of control signals provided to the actuator 504. The displacement signal may be based on an electrical capacitance determination between the electrodes 507 and 508. A similar approach may be used with one or more other pair or other combination of electrodes.

Figure 6:
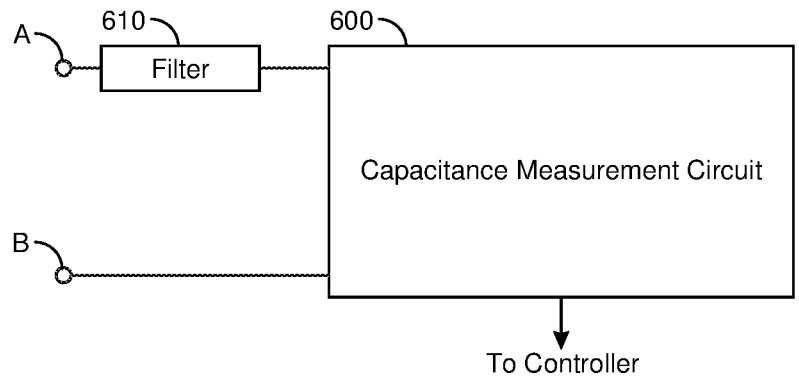
FIG. 6 depicts an exemplary displacement sensor in accordance with some embodiments.

FIG. 6 depicts an exemplary displacement sensor in accordance with some embodiments. In this example, an electrode spacing is determined using a capacitance measurement circuit 600. The capacitance measurement circuit may be connected between two electrodes on the NVP element, for example, connected to electrodes on opposite surfaces of an NVP element. For example, the electrode spacing may be a spacing between electrode array elements, or between a first and second electrode. An electrode spacing may change due to a deformation in the NVP element. A deformation of the NVP, for example, relative to an undeformed state and/or a state with no applied voltage, can be measured (sensed) through the change in electrode spacing and consequent change in capacitance. The results may be divided by the undeformed capacitance and the ratio used to determine a deformation ratio. In some examples, it may be assumed that capacitance is inversely proportional to electrode separation, e.g., for the case of generally parallel electrodes. The capacitance measurement circuit may be used as an example displacement sensor (e.g., as shown at 506 in FIG. 5). The electrical connections shown (A and B) may electrically connect to electrodes supported on the NVP element of FIG. 5, for example, across a pair of electrodes of the NVP. There may also be electrical communication between the capacitance measurement circuit and a controller, for example, the controller 500 of FIG. 5.

The capacitance measurement circuit 600 may be used with an appropriate filter 610 to determine capacitance measurements. The capacitance measurement circuit 600 may be used as an example displacement sensor, such as displacement sensor 506 in FIG. 5. The electrical connections "A" and "B" in FIG. 6 may correspond to the similarly labeled connections in FIG. 5. The filter 610 may be used for appropriate passing or rejection of drive fields and/or separate measurement fields if used. For example, actuation and capacitance measurements may use different frequencies, and/or may be time gated. In some examples, actuation can also be generated mechanically, or using acoustic waves, and a displacement sensor may be used to determine the degree of displacement (e.g., a change in separation of electrodes, due to electrically-induced compression of an NVP, etc.).

A controller may receive the capacitance measurements and determine an electrode displacement for the NVP, and may determine a deformation, configuration, actuation, or other deformation of the NVP element from one or more such capacitance measurements. A filter 610 (which is optional) may facilitate simultaneous or near-simultaneous actuation and sensing, for example, using AC and DC signals, or using different frequency components for actuation and sensing.

There are several approaches that may be used to generate actuation, and sense displacement, for the same (or similar) portion of a nanovoided polymer (NVP). For example, application of an electrical field may be time-gated (with appropriate calculation of RMS electrical field), and capacitance determined while no drive field is applied. In this context, a drive field may be an electric field used to induce actuation. In other approaches, different frequency domains may be used for actuation drive and displacement sensor measurement. For example, a direct field may be used for actuation, and an alternating field used for displacement sensing. The AC field may be negligible relative to the drive field or determination of RMS applied field appropriately corrected for drive field determination.

Figure 7:
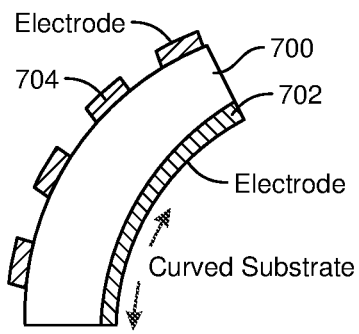
FIG. 7 depicts an exemplary conformal touch sensor in accordance with some embodiments.

FIG. 7 depicts an exemplary conformal touch sensor in accordance with some embodiments. The sensor may include an NVP element 700, a common electrode 702, and a plurality of electrodes on a surface of the NVP element opposite the common electrode, such as electrode 704. In some examples, a touch sensor may be conformed to an underlying curved surface. The NVP may be flexible, and the electrodes and any other layers associated with the NVP may be flexible. In some examples, the touch sensor may be generally transparent, allowing viewing of an underlying substrate, or visual display or graphic element disposed thereon.

Figure 8:
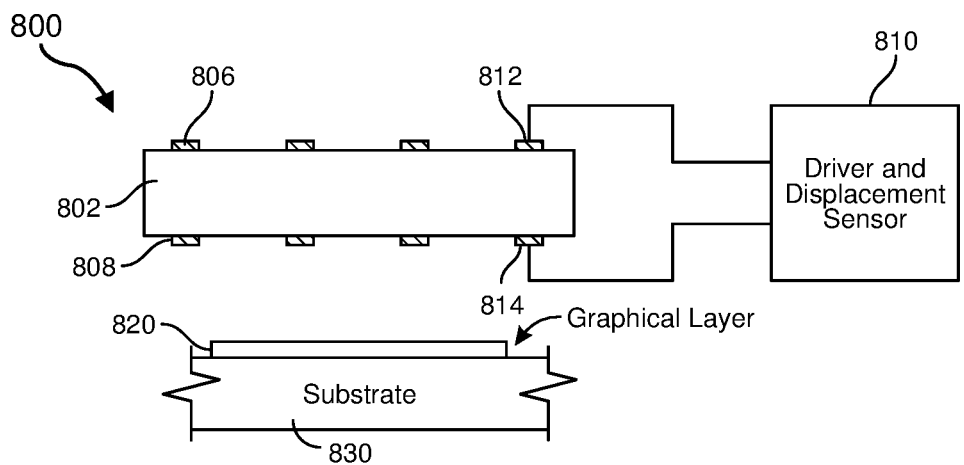
FIG. 8 depicts an exemplary combined actuator/displacement sensor in accordance with some embodiments, which may be transparent.

FIG. 8 depicts an exemplary device, which in this example includes a combined actuator/displacement sensor in accordance with some embodiments. The example device 800 includes NVP element 802, having a first surface supporting a first plurality of electrodes such as electrodes 806 and 812, and a second surface supporting a second plurality of electrodes such as electrodes 808 and 814. A control circuit 810, including a driver and displacement sensor, may apply electrical signals to selected electrodes, and may determine displacement using, for example, capacitance measurements. Only electrical connections to electrodes 812 and 814 are shown for illustrative simplicity. The figure shows a cross-sectional view of the device, and the device may be transparent, allowing viewing of a graphical layer 820 on a substrate 830 located below the device. The graphical layer 820 may include, for example, fixed graphics, a display (such as an electronic display), and the like. The NVP element 802 may be used to modify a view of the graphical layer 820 through the NVP element, for example by changes in optical properties of an NVP layer. In some examples, the NVP element may provide a touch sensor, and the displacement sensor may be configured to detect a touch input.

Figure 9:
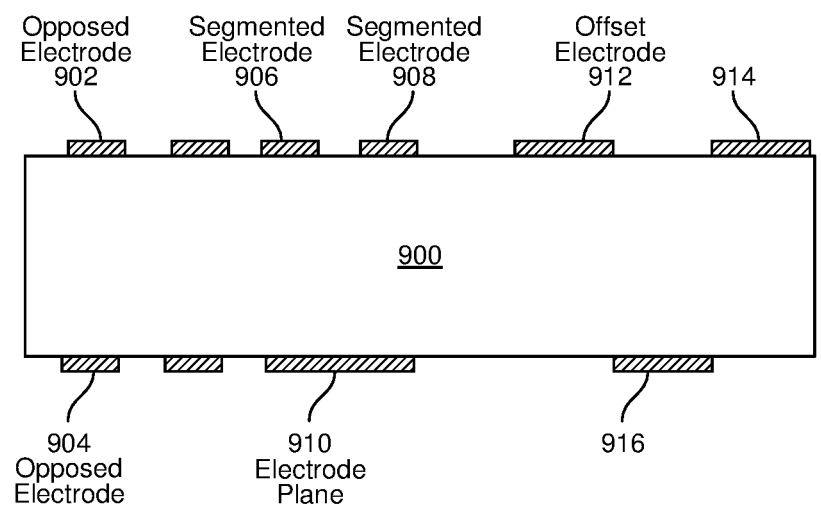
FIG. 9 depicts exemplary electrode arrangements in accordance with some embodiments.

FIG. 9 depicts exemplary electrode arrangements in accordance with some embodiments. The NVP element 900 may have a first surface supporting a first plurality of electrodes, such as electrodes 902, 906, 908, 912, and 914. The NVP element may have a second surface supporting a second plurality of electrodes, such as electrodes 904, 910, and 916. A portion of the NVP element may have electrodes 902 and 904, which are opposed electrodes and are generally in positional registration (e.g., aligned along a direction normal to a plane of the electrodes, at least in a non-distorted state). Actuation may be driven by an electrical potential applied between the pair of opposed electrodes 902 and 904. In some examples, a portion of the NVP element may include a pair of electrodes such as 906 and 908, labeled "segmented electrodes" opposite a common electrode 910 (labeled "electrode plane"). A common electrode may be held at a reference potential, such as ground, and other electrical potentials applied to one or more opposed electrodes may be adjusted to drive actuation, and to obtain various deformation profiles. A common electrode may be opposite a plurality of electrodes on the opposite surface of the NVP element. In some examples, a portion of the NVP element may support offset electrodes 912, 914, and 916. Electrodes 912 and 914 may be on an opposite surface of the NVP element 900 than the electrode 916. However, the electrodes 912 and 914 may not be in positional registration with electrode 916. An electrical potential applied between any pair of offset electrodes (e.g., on opposite surfaces of the NVP element) may include an electrical field that has components both parallel and perpendicular to the plane of the electrodes. This approach may be used to induce, for example, bending and vibration, which may be used, e.g., in haptic devices. An NVP element may include one or more of the illustrated electrode configurations, which may be repeated over a spatial extent of the NVP element.

Figure 10:
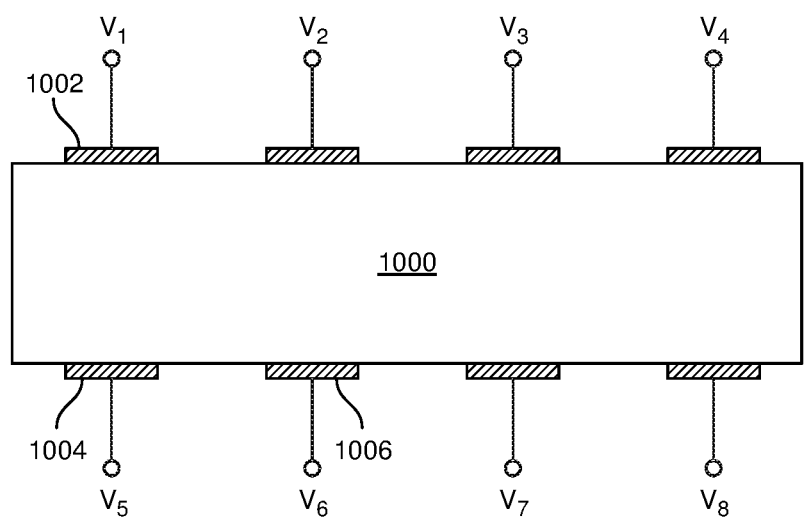
FIG. 10 depicts an exemplary electrode arrangement in accordance with some embodiments.

FIG. 10 depicts an exemplary electrode arrangement in accordance with some embodiments. As shown in this figure, a device may include an NVP element 1000 having a plurality of electrodes (such as electrode 1002) on a first surface, and a second plurality of electrodes (such as electrode 1004 and 1006) on a second surface. A control circuit (not shown) may be used to apply voltages $V_1 \ldots V_8$ to each (or some) of the various illustrated electrodes. For example, there may be electrical potential differences (voltages) between various electrodes, for example, between $V_1$ and $V_5$, $V_2$ and $V_6$, $V_3$ and $V_7$, and/or between electrodes $V_4$ and $V_8$. Selective compression of an end portion may be achieved by applying an electrical potential across an end portion, for example, between electrode 1002 (at potential $V_1$) and electrode 1004 (at potential $V_5$), or between potentials $V_4$ and $V_8$. For compression of a central region, an electrical potential may be applied between opposed electrodes within the central portion, for example, by applying differing electrical potentials at $V_2$ and $V_6$, and/or between $V_3$ and $V_7$. It is also possible to obtain a component of in-plane electrical field (and hence in-plane compression) by applying an electrical potential between laterally offset electrodes, for example, using a potential difference between $V_1$ and either $V_6$, $V_7$, or $V_8$. Other electrodes may float (e.g., be electrically isolated), be grounded, or have some other electrical potential applied to them.

Furthermore, a control circuit may be used to dynamically adjust electric potentials to provide vibratory or other oscillatory deformations, which may be used to provide haptic feedback.

FIG. 11 depicts an exemplary device 1100 (e.g., an electrically adjustable mirror) in accordance with some embodiments. The device 1100 has a lower electrode 1108, which in this example is not deformed. For example, the lower electrode 1108 may be supported on a relatively rigid lower substrate layer, and/or may be a relatively rigid electrode such as a metal layer. An NVP element 1106 may be located between the lower electrode and a substrate 1102, in this example a deformable substrate. An electrical potential may be applied between one or more of the upper electrodes (such as electrode 1104) and the lower electrode 1108 to obtain a desired curvature of the substrate 1102 and the reflector 1110 disposed thereon. The device 1100 may be a mirror with an electrically adjustable focal length. In some examples, the separate reflector may be omitted, and reflection obtained from one or more reflective electrodes. For example, the electrode on the deformable surface (such as 1104) may be reflective to incident light, and the electrodes may cover most or substantially all of the deformable surface of the NVP element (e.g., the device may have gaps between the electrodes on the deformable surface that are appreciably narrower than the electrode widths). Electrodes may be located on either or both sides of any substrate, and in some examples may be embedded within a substrate. For a device with reflective electrodes and not a separate reflective layer, there may be non-reflective areas, where the electrodes are absent (or, e.g., covered with a non-reflective region). Example devices may include an array of mirrors (such as an array of micromirrors in which individual mirrors may have millimeter or sub-millimeter dimensions), where each individual mirror element can be independently aligned or oriented. Example devices can be used in digital light processing, for example, used in similar applications as MEMS devices, for example, in display applications, including light projection devices. In some examples, electrodes may have a reflectivity (e.g., at visible wavelengths) of at least approximately 85%, and in some examples, the electrode reflectivity may be at least approximately 90%.

FIG. 12 depicts an exemplary device (e.g., an electrically adjustable mirror such as a beam deflector) in accordance with some embodiments. The device 1200 includes a substrate 1202, in this example a deformable substrate, and a lower electrode 1204 which in this example is not deformed. For example, the lower electrode may be relatively rigid, or may be supported on a relatively rigid lower substrate layer. An NVP layer 1212 may be disposed between the lower electrode 1204 and the substrate 1202. An electrical potential may be applied between the upper electrode 1210 (in this example, located near an edge of the device) and the lower electrode 1204, causing constriction of an edge portion of the NVP element 1212 and a corresponding portion of the substrate 1202. A reflector 1208 located on the upper surface of the substrate 1202 may be deflected by deformation of the NVP element. One or more optional pillars or similar spacing elements, such as pillar 1206, may be used to maintain a predetermined thickness at one or more locations within the NVP element. In some examples, electrodes such as electrode 1210 may be disposed on either the upper or lower surface of the substrate 1202.

In some examples, a device may be configured as an electrically controlled beam deflector or beam steering device. In some examples, there may be a separate electrode and reflector on a substrate layer, though these may both be provided by a single reflective electrically conducting layer. A reflector, or combined reflector/electrode layer, may be located on either side of the substrate 1202.

Figure 13:
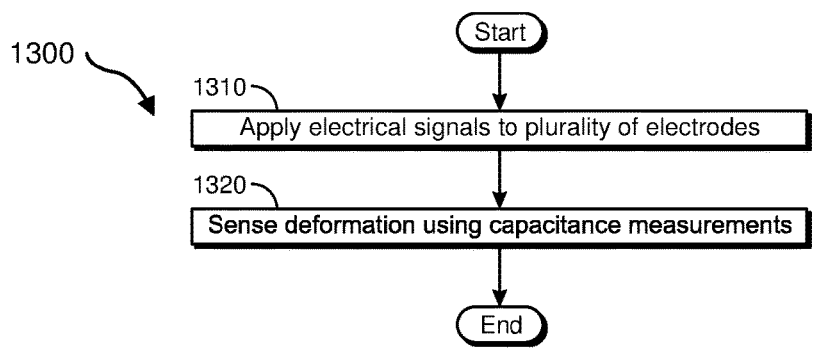
FIG. 13 depicts a computer-implemented method in accordance with some embodiments.

FIG. 13 is a flow diagram of an exemplary method for operating an electroactive device, which may be a computer-implemented method. The method 1300 may include applying electrical signals to a plurality of electrodes (1310), for example, supported on one or more surfaces of an NVP element, and the application of the electrical signals may induce a deformation of the NVP element. The method may further include sensing the deformation (1320), for example, using determination of a physical parameter, such as an electrical parameter, such as, for example, capacitance measurements between electrodes. The sensing electrodes, between which an electrical parameter may be determined, may include the same or different electrodes used to apply the electrical signals to the NVP element. The steps shown in FIG. 13 may be performed by any suitable computer-executable code and/or computing system, including the system illustrated in FIG. 5. In some examples, each of the steps shown in FIG. 13 (or FIG. 14, below) may represent an algorithm whose structure includes and/or is represented by multiple sub-steps, examples of which will be provided in greater detail below.

Figure 14:
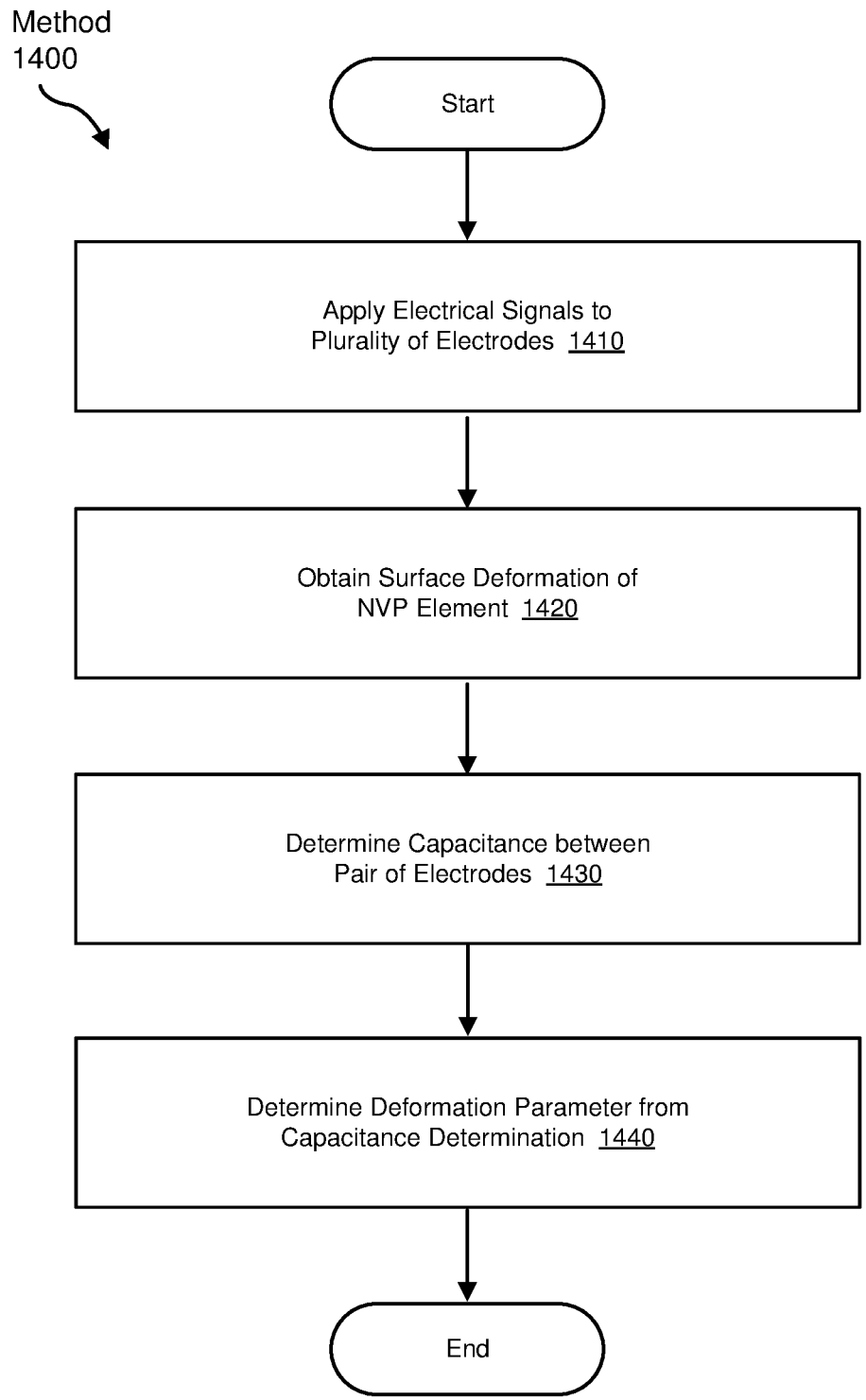
FIG. 14 is a flow diagram of an exemplary method for electrically controlled actuation

FIG. 14 is a flow diagram of an exemplary method for operating an electroactive device, which may be a computer-implemented method. The method 1400 may include applying electrical signals to a plurality of electrodes on an NVP element (1410), obtaining a surface deformation of the NVP in response to the electrical signals (1420), determining a capacitance (or other physical parameter) between a pair of electrodes on the NVP (1430), and determining a deformation parameter from the capacitance measurement (1440). In some examples, the determined deformation parameter based on the applied electrical signal may be used to improve the accuracy of desired deformations based on the electrical signals. For example, the determined physical parameter, such as an electrical parameter such as capacitance, may be used to calibrate the electrical signals applied to the NVP element to obtain a desired response.

One or more of the system components described herein may be configured to apply electrical signals to a plurality of electrodes of an electroactive device, for example, to obtain a desired surface deformation of an actuator and in some examples of an optical element including an actuator. In some examples, a computer-implemented method may further include determination of a capacitance between one or more pairs of electrodes within the plurality of electrodes to determine an actual deformation of an actuator. A sensed (determined) actuation may be compared with a desired (driven) actuation and used to correct driving voltage, for example, to improve actuation accuracy, for example, by adjusting the drive voltage.

Example devices may be used in a range of applications. For example, a spatially addressed nanovoided polymer can be locally actuated and can sense segmental variations in signals. This segmental actuation may be controlled by the size and arrangement of the electrodes at that location, and the amount of voltage applied at those electrodes. Example devices can be used as an optical element, a touch sensor, a thermal sensor, a pressure sensor, or a haptic element in a wearable device. In some examples, a device may function as both a sensor (such as a touch sensor or conformation sensor) and haptic element at the same time. Example devices include a touch sensor, a haptic element, or a combined touch sensor and a haptic element. In some examples, a device may be a hydrostatic sensor and/or transducer, an acoustic sensor and/or transducer, or other sensor. Electrodes may be arranged to allow any desired deformation, such as any desired 3D deformation. Example deformations may include curvatures or oscillatory components along one or more directions. Devices and components thereof may be fabricated using one or more deposition processes, such as CVD (chemical vapor deposition), other vapor deposition processes, spin coating, 3D printing, and the like. For example, polymer elements may be fabricated, for example, using initiated chemical vapor deposition. In some examples, local transistors may be used to control switching of an NVP element. In some examples, a device may include orthogonal arrangements of electrode stripes on opposite surfaces, with pixels defined by an overlapping portion.

An example device includes a nanovoided polymer (NVP) element; a first electrode; and a second electrode, where the nanovoided polymer element is located at least in part between the first electrode and the second electrode. The device may be a spatially addressable electroactive device, such as an actuator or a sensor. The device may further include a control circuit, with the control circuit being configured to apply an electrical potential between the first electrode and the second electrode. The control circuit may be further configured to determine a physical deformation between the first electrode and the second electrode, for example, based on a capacitance determination. The device may be generally transparent, for example, including a nanovoided polymer that is generally transparent, and transparent electrodes (e.g., transparent conductive oxide electrodes such as tin oxide, indium tin oxide, and the like). A first electrode (and/or a second electrode) may be generally transparent, or in some examples may be generally reflective. The device may be flexible, and in some examples transparent and flexible. An example nanovoided polymer element may have a first surface and a second surface, where the first surface supports a first plurality of electrodes including the first electrode, and/or the second surface supports a second plurality of electrodes including the second electrode.

The device may also include a spatially addressable actuator. Application of an electrical signal between the first electrode and the second electrode, and/or between other electrodes of the device, may induce a 3-dimensional conformational change of the nanovoided polymer element. In some examples, the device is an electrically controllable optical element, which may include one or more of a mirror, a lens, a prism, a grating, a phase place, a diffuser, a holographic element, a beam splitter, a beam combiner, or an optical filter. In some examples, the device may include a sensor, such as a touch sensor. An actuator may be controlled by an electrical potential between the first electrode and the second electrode, and a sensor responsive to a capacitance between the first electrode and the second electrode may be used to determine a degree of actuation (such as a displacement, relative displacement, or other deformation parameter).

In some examples, a computer-implemented method includes application of electrical signals to a plurality of electrodes to obtain a desired surface deformation of an actuator. In some examples, the computer-implemented method may further include determination of a capacitance between one or more pairs of electrodes (e.g., within a plurality of electrodes) to determine an actual deformation of an actuator. A sensed (determined) actuation may be compared with a desired (driven) actuation and used to correct driving voltages.

An example system may include at least one physical processor, a physical memory including computer-executable instructions that, when executed by the physical processor, cause the physical processor to control application of electrical signals to a plurality of electrodes to obtain a desired surface deformation of an actuator. In some examples, a computer-implemented method includes (e.g., further includes) determination of a capacitance between one or more pairs of electrodes (e.g., within a plurality of electrodes) to determine an actual deformation of an actuator.

In some examples, a non-transitory computer-readable medium may include one or more computer-executable instructions that, when executed by at least one processor of a computing device, cause the computing device to control application of electrical signals to a plurality of electrodes to obtain a desired surface deformation of an actuator, along with, in some examples, sensing of the deformation. In some examples, signals of the same polarity may be applied to proximate electrodes to generate electrostatic repulsion and, for example, an increase in electrode separation.

In some examples, any method herein described may be encoded as computer-readable instructions on a computer-readable medium. For example, a computer-readable medium may include one or more computer-executable instructions that, when executed by at least one processor of a computing device, may cause the computing device to apply electrical signals to a plurality of electrodes of an electroactive device including a nanovoided polymer (NVP) element, to obtain a desired surface deformation of the electroactive device. In some examples, a spatial distribution of deformation may be obtained, and in some examples may be determined through spatially-resolved capacitance measurements.

In some examples, a device includes a nanovoided polymer element, a first electrode, and a second electrode, where the nanovoided polymer element is located at least in part between the first electrode and the second electrode, and the device is a spatially addressable electroactive device. A device may further include a control circuit configured to apply an electrical potential between the first electrode and the second electrode. The control circuit may be further configured to determine a physical deformation between the first electrode and the second electrode. In some examples, the nanovoided polymer may be generally transparent or translucent, for example, at visible wavelengths. The first electrode may be generally transparent, or generally reflective. In some examples, the device may be flexible, and may be conformed to a non-planar substrate. The nanovoided polymer element may have a first surface and a second surface, and the first surface may support a first plurality of electrodes including the first electrode. The second electrode may be generally transparent, or generally reflective, and the second surface may support a second plurality of electrodes including the second electrode. In some examples, the device may be, or include, a spatially addressable actuator. Application of an electrical signal between the first electrode and the second electrode may induce a 3-dimensional conformational change of the nanovoided polymer element. The device may be, or include, an electrically controllable optical element. An electrically-controlled optical element may include one or more of a mirror, a lens, a prism, a grating, a phase plate, a diffuser, a holographic element, a beam splitter, a beam combiner, or an optical filter.

The device may also include a sensor, such as a touch sensor. In addition, the device may include an actuator, for example, controlled by an electrical potential between the first electrode and the second electrode, and a sensor responsive to a capacitance between the first electrode and the second electrode. In some examples, the device includes a nanovoided polymer (NVP) element, a first electrode, and a second electrode, where the nanovoided polymer element is located at least in part between the first electrode and the second electrode. The device may be a spatially addressable electroactive device, such as an actuator or a sensor, and may include an optical element. The device may further include a control circuit, the control circuit being configured to apply an electrical potential between the first electrode and the second electrode. The control circuit may be further configured to determine a physical deformation between the first electrode and the second electrode, for example, based on a capacitance determination.

In some examples, a method includes applying electrical signals to a plurality of electrodes of an electroactive device comprising a nanovoided polymer element, to obtain a desired surface deformation of the electroactive device. The method may further include determining a capacitance between one or more pairs of electrodes within the plurality of electrodes to determine an actual deformation of an electroactive device.

In some examples, a system includes at least one physical processor, and physical memory including computer-executable instructions that, when executed by the physical processor, cause the physical processor to apply electrical signals to a plurality of electrodes of an electroactive device comprising a nanovoided polymer element to obtain a desired surface deformation of an electroactive device. The system may include a haptic device, and the desired surface deformation may be induced within the haptic device.

EXAMPLE EMBODIMENTS

Example 1

A device comprising a nanovoided polymer element having a first surface and a second surface, a first plurality of electrodes disposed on the first surface, a second electrode (which may be one or a second plurality of electrodes) disposed on the second surface, and a control circuit configured to apply an electrical potential between one or more of the first plurality of electrodes and the second electrode to induce a physical deformation of the nanovoided polymer element.

Example 2

The device of example 1, where the control circuit is further configured to determine the physical deformation of the nanovoided polymer element using a capacitance measurement between one or more of the first plurality of electrodes and the second electrode, or one or more of a second plurality of electrodes.

Example 3

The device of examples 1 or 2, where the device is an actuator, such as a spatially addressable actuator.

Example 4

The device of examples 1-3, where the physical deformation includes a spatially varying compression and/or expansion of the nanovoided polymer element.

Example 5

The device of examples 1-4, where the nanovoided polymer element includes a polymer having a plurality of nanovoids disposed therein.

Example 6

The device of examples 1-5, where the nanovoided polymer element is flexible.

Example 7

The device of examples 1-6, where the polymer is an acrylate polymer or a silicone polymer.

Example 8

The device of examples 1-7, where the nanovoided polymer is generally transparent, the first plurality of electrodes is generally transparent or generally reflective, and the second electrode, which may be one of a second plurality of electrodes, is generally transparent or generally reflective.

Example 9

The device of examples 1-8, where the physical deformation of the nanovoided polymer element induces a spatially varying refractive index of the nanovoided polymer element.

Example 10

The device of examples 1-9, where the device includes an electrically controllable optical element.

Example 11

The device of example 10, where the electrically-controlled optical element comprises one or more of a mirror, a lens, a prism, a grating, a phase plate, a diffuser, a holographic element, a beam splitter, a beam combiner, or an optical filter.

Example 12

The device of example 10, where the optical element includes a mirror, and the physical deformation of the nanovoided polymer element induces a spatially varying deformation of the mirror.

Example 13

A device comprising a nanovoided polymer element, a first electrode, a second electrode where the nanovoided polymer element is located at least in part between the first electrode and the second electrode, and a control circuit, where the control circuit is configured to apply an electrical potential between the first electrode and the second electrode to induce a physical deformation of the nanovoided polymer element, and determine an electrical capacitance between the first electrode and the second electrode to determine a parameter of the physical deformation.

Example 14

The device of example 13, where the device includes an electrically controllable optical element.

Example 15

The device of example 14, where the electrically-controlled optical element comprises one or more of a mirror, a lens, a prism, a grating, a phase plate, a diffuser, a holographic element, a beam splitter, a beam combiner, or an optical filter.

Example 16

The device of example 13, comprising an actuator controlled by an electrical potential between the first electrode and the second electrode, and a sensor responsive to a capacitance between the first electrode and the second electrode.

Example 17

The device of example 16, where the optical element includes a mirror, and the physical deformation of the nanovoided polymer element induces a spatially varying deformation of the mirror.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 1500 in FIG. 15. Other artificial reality systems may include a NED that also provides visibility into the real world (e.g., augmented-reality system 1600 in FIG. 16) or that visually immerses a user in an artificial reality (e.g., virtual-reality system 1700 in FIG. 17). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 15:
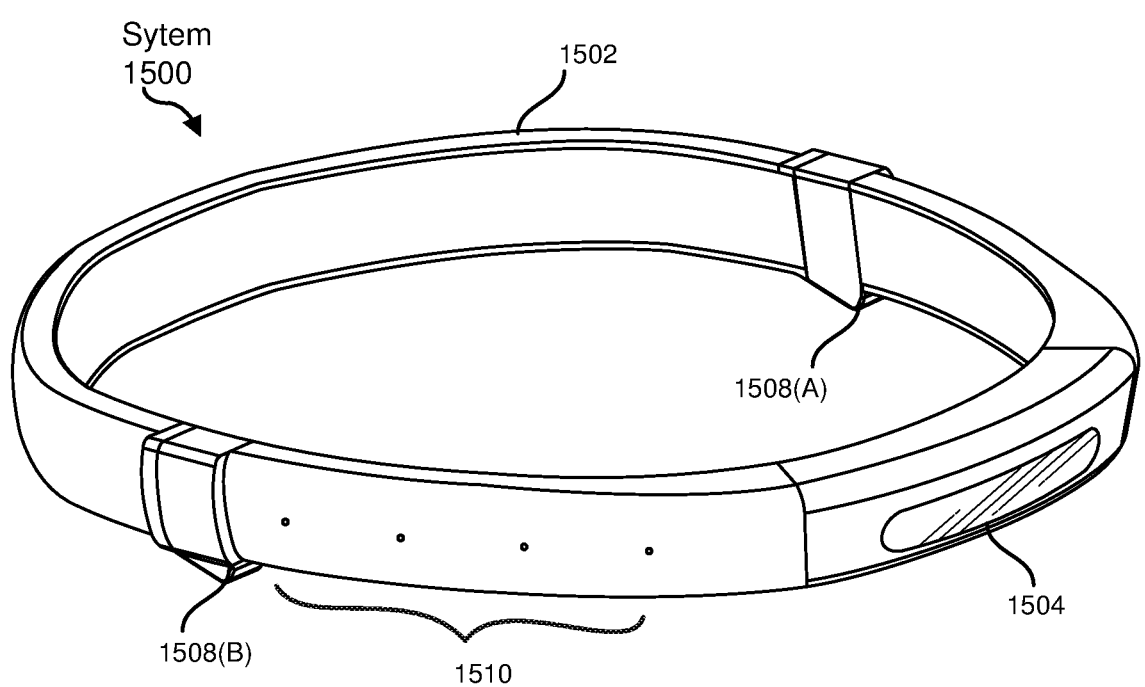
FIG. 15 is an illustration of an exemplary artificial-reality headband that may be used in connection with embodiments of this disclosure.

Turning to FIG. 15, augmented-reality system 1500 generally represents a wearable device dimensioned to fit about a body part (e.g., a head) of a user. As shown in FIG. 15, system 1500 may include a frame 1502 and a camera assembly 1504 that is coupled to frame 1502 and configured to gather information about a local environment by observing the local environment. Augmented-reality system 1500 may also include one or more audio devices, such as output audio transducers 1508(A) and 1508(B) and input audio transducers 1510. Output audio transducers 1508(A) and 1508(B) may provide audio feedback and/or content to a user, and input audio transducers 1510 may capture audio in a user's environment.

As shown, augmented-reality system 1500 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1500 may not include a NED, augmented-reality system 1500 may include other types of screens or visual feedback devices (e.g., a display screen integrated into a side of frame 1502).

Figure 16:
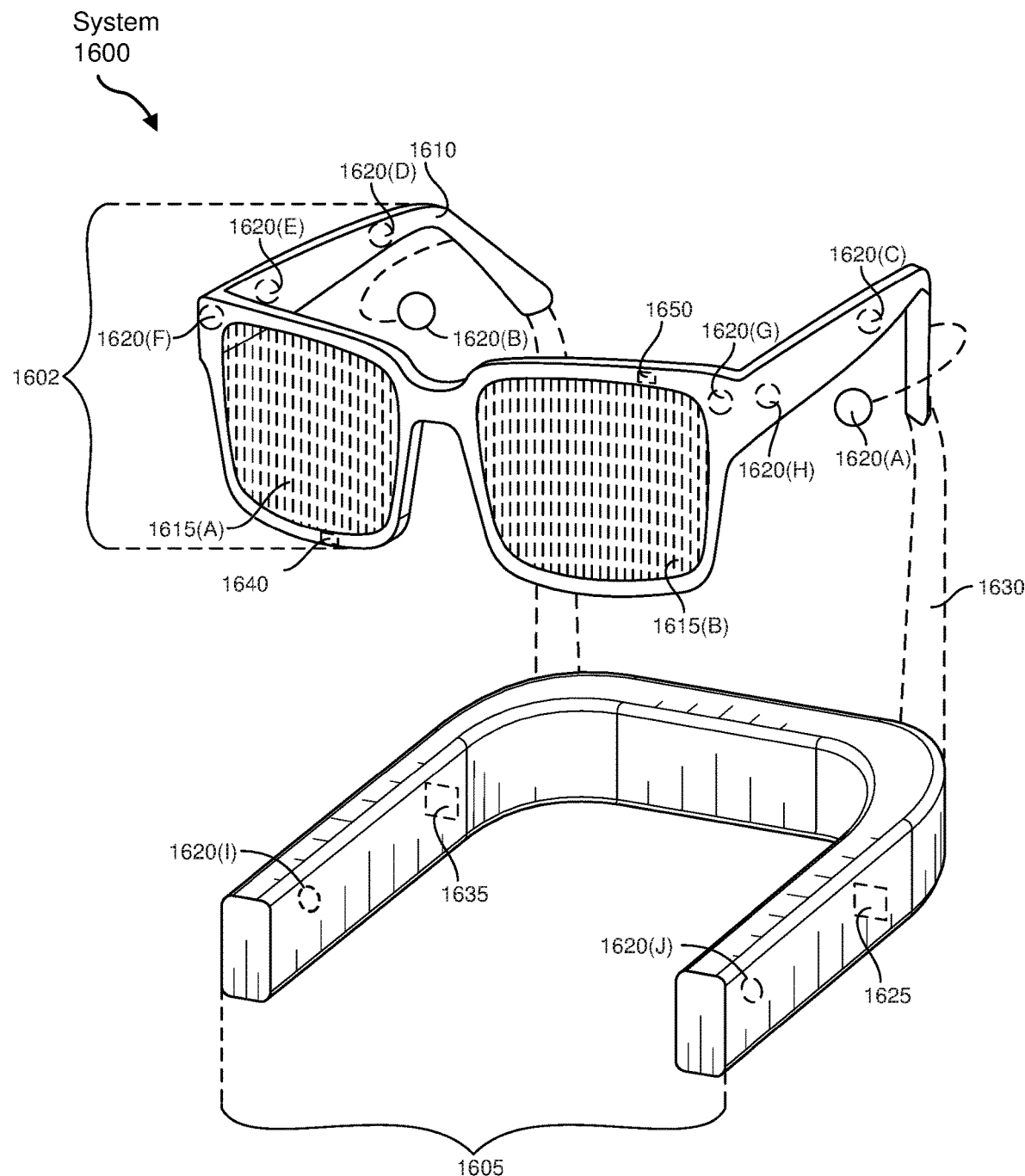
FIG. 16 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 16, augmented-reality system 1600 may include an eyewear device 1602 with a frame 1610 configured to hold a left display device 1615(A) and a right display device 1615(B) in front of a user's eyes. Display devices 1615(A) and 1615(B) may act together or independently to present an image or series of images to a user. While augmented-reality system 1600 includes two displays, embodiments of this disclosure may be implemented in augmented-reality systems with a single NED or more than two NEDs.

In some embodiments, augmented-reality system 1600 may include one or more sensors, such as sensor 1640. Sensor 1640 may generate measurement signals in response to motion of augmented-reality system 1600 and may be located on substantially any portion of frame 1610. Sensor 1640 may represent a position sensor, an inertial measurement unit (IMU), a depth camera assembly, or any combination thereof. In some embodiments, augmented-reality system 1600 may or may not include sensor 1640 or may include more than one sensor. In embodiments in which sensor 1640 includes an IMU, the IMU may generate calibration data based on measurement signals from sensor 1640. Examples of sensor 1640 may include, without limitation, accelerometers, gyroscopes, magnetometers, other suitable types of sensors that detect motion, sensors used for error correction of the IMU, or some combination thereof.

Augmented-reality system 1600 may also include a microphone array with a plurality of acoustic transducers 1620(A)-1620(J), referred to collectively as acoustic transducers 1620. Acoustic transducers 1620 may be transducers that detect air pressure variations induced by sound waves. Each acoustic transducer 1620 may be configured to detect sound and convert the detected sound into an electronic format (e.g., an analog or digital format). The microphone array in FIG. 2 may include, for example, ten acoustic transducers: 1620(A) and 1620(B), which may be designed to be placed inside a corresponding ear of the user, acoustic transducers 1620(C), 1620(D), 1620(E), 1620(F), 1620(G), and 1620(H), which may be positioned at various locations on frame 1610, and/or acoustic transducers 1620(I) and 1620(J), which may be positioned on a corresponding neckband 1605.

In some embodiments, one or more of acoustic transducers 1620(A)-(F) may be used as output transducers (e.g., speakers). For example, acoustic transducers 1620(A) and/or 1620(B) may be earbuds or any other suitable type of headphone or speaker.

The configuration of acoustic transducers 1620 of the microphone array may vary. While augmented-reality system 1600 is shown in FIG. 16 as having ten acoustic transducers 1620, the number of acoustic transducers 1620 may be greater or less than ten. In some embodiments, using higher numbers of acoustic transducers 1620 may increase the amount of audio information collected and/or the sensitivity and accuracy of the audio information. In contrast, using a lower number of acoustic transducers 1620 may decrease the computing power required by the controller 1650 to process the collected audio information. In addition, the position of each acoustic transducer 1620 of the microphone array may vary. For example, the position of an acoustic transducer 1620 may include a defined position on the user, a defined coordinate on frame 1610, an orientation associated with each acoustic transducer, or some combination thereof.

Acoustic transducers 1620(A) and 1620(B) may be positioned on different parts of the user's ear, such as behind the pinna or within the auricle or fossa. Or, there may be additional acoustic transducers on or surrounding the ear in addition to acoustic transducers 1620 inside the ear canal. Having an acoustic transducer positioned next to an ear canal of a user may enable the microphone array to collect information on how sounds arrive at the ear canal. By positioning at least two of acoustic transducers 1620 on either side of a user's head (e.g., as binaural microphones), augmented-reality device 1600 may simulate binaural hearing and capture a 3D stereo sound field around about a user's head. In some embodiments, acoustic transducers 1620(A) and 1620(B) may be connected to augmented-reality system 1600 via a wired connection 1630, and in other embodiments, acoustic transducers 1620(A) and 1620(B) may be connected to augmented-reality system 1600 via a wireless connection (e.g., a Bluetooth connection). In still other embodiments, acoustic transducers 1620(A) and 1620(B) may not be used at all in conjunction with augmented-reality system 1600.

Acoustic transducers 1620 on frame 1610 may be positioned along the length of the temples, across the bridge, above or below display devices 1615(A) and 1615(B), or some combination thereof. Acoustic transducers 1620 may be oriented such that the microphone array is able to detect sounds in a wide range of directions surrounding the user wearing the augmented-reality system 1600. In some embodiments, an optimization process may be performed during manufacturing of augmented-reality system 1600 to determine relative positioning of each acoustic transducer 1620 in the microphone array.

In some examples, augmented-reality system 1600 may include or be connected to an external device (e.g., a paired device), such as neckband 1605. Neckband 1605 generally represents any type or form of paired device. Thus, the following discussion of neckband 1605 may also apply to various other paired devices, such as charging cases, smart watches, smart phones, wrist bands, other wearable devices, hand-held controllers, tablet computers, laptop computers and other external compute devices, etc.

As shown, neckband 1605 may be coupled to eyewear device 1602 via one or more connectors. The connectors may be wired or wireless and may include electrical and/or non-electrical (e.g., structural) components. In some cases, eyewear device 1602 and neckband 1605 may operate independently without any wired or wireless connection between them. While FIG. 16 illustrates the components of eyewear device 1602 and neckband 1605 in example locations on eyewear device 1602 and neckband 1605, the components may be located elsewhere and/or distributed differently on eyewear device 1602 and/or neckband 1605. In some embodiments, the components of eyewear device 1602 and neckband 1605 may be located on one or more additional peripheral devices paired with eyewear device 1602, neckband 1605, or some combination thereof. Furthermore, Pairing external devices, such as neckband 1605, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1600 may be provided by a paired device or shared between a paired device and an eyewear device, thus reducing the weight, heat profile, and form factor of the eyewear device overall while still retaining desired functionality. For example, neckband 1605 may allow components that would otherwise be included on an eyewear device to be included in neckband 1605 since users may tolerate a heavier weight load on their shoulders than they would tolerate on their heads. Neckband 1605 may also have a larger surface area over which to diffuse and disperse heat to the ambient environment. Thus, neckband 1605 may allow for greater battery and computation capacity than might otherwise have been possible on a stand-alone eyewear device. Since weight carried in neckband 1605 may be less invasive to a user than weight carried in eyewear device 1602, a user may tolerate wearing a lighter eyewear device and carrying or wearing the paired device for greater lengths of time than a user would tolerate wearing a heavy standalone eyewear device, thereby enabling users to more fully incorporate artificial reality environments into their day-to-day activities.

Neckband 1605 may be communicatively coupled with eyewear device 1602 and/or to other devices. These other devices may provide certain functions (e.g., tracking, localizing, depth mapping, processing, storage, etc.) to augmented-reality system 1600. In the embodiment of FIG. 16, neckband 1605 may include two acoustic transducers (e.g., 1620(I) and 1620(J)) that are part of the microphone array (or potentially form their own microphone subarray). Neckband 1605 may also include a controller 1625 and a power source 1635.

Acoustic transducers 1620(I) and 1620(J) of neckband 1605 may be configured to detect sound and convert the detected sound into an electronic format (analog or digital). In the embodiment of FIG. 16, acoustic transducers 1620(I) and 1620(J) may be positioned on neckband 1605, thereby increasing the distance between the neckband acoustic transducers 1620(I) and 1620(J) and other acoustic transducers 1620 positioned on eyewear device 1602. In some cases, increasing the distance between acoustic transducers 1620 of the microphone array may improve the accuracy of beamforming performed via the microphone array. For example, if a sound is detected by acoustic transducers 1620(C) and 1620(D) and the distance between acoustic transducers 1620(C) and 1620(D) is greater than, e.g., the distance between acoustic transducers 1620(D) and 1620(E), the determined source location of the detected sound may be more accurate than if the sound had been detected by acoustic transducers 1620(D) and 1620(E).

Controller 1625 of neckband 1605 may process information generated by the sensors on 1605 and/or augmented-reality system 1600. For example, controller 1625 may process information from the microphone array that describes sounds detected by the microphone array. For each detected sound, controller 1625 may perform a direction-of-arrival (DOA) estimation to estimate a direction from which the detected sound arrived at the microphone array. As the microphone array detects sounds, controller 1625 may populate an audio data set with the information. In embodiments in which augmented-reality system 1600 includes an inertial measurement unit, controller 1625 may compute all inertial and spatial calculations from the IMU located on eyewear device 1602. A connector may convey information between augmented-reality system 1600 and neckband 1605 and between augmented-reality system 1600 and controller 1625. The information may be in the form of optical data, electrical data, wireless data, or any other transmittable data form. Moving the processing of information generated by augmented-reality system 1600 to neckband 1605 may reduce weight and heat in eyewear device 1602, making it more comfortable to the user.

Power source 1635 in neckband 1605 may provide power to eyewear device 1602 and/or to neckband 1605. Power source 1635 may include, without limitation, lithium ion batteries, lithium-polymer batteries, primary lithium batteries, alkaline batteries, or any other form of power storage. In some cases, power source 1635 may be a wired power source. Including power source 1635 on neckband 1605 instead of on eyewear device 1602 may help better distribute the weight and heat generated by power source 1635.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1700 in FIG. 17, that mostly or completely covers a user's field of view. Virtual-reality system 1700 may include a front rigid body 1702 and a band 1704 shaped to fit around a user's head. Virtual-reality system 1700 may also include output audio transducers 1706(A) and 1706(B). Furthermore, while not shown in FIG. 17, front rigid body 1702 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1700 and/or virtual-reality system 1700 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1600 and/or virtual-reality system 1700 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1500, augmented-reality system 1600, and/or virtual-reality system 1700 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 15 and 17, output audio transducers 1508(A), 1508(B), 1706(A), and 1706(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1510 may include condenser microphones, dynamic microphones, ribbon microphones, and/or any other type or form of input transducer. In some embodiments, a single transducer may be used for both audio input and audio output.

Figure 17:
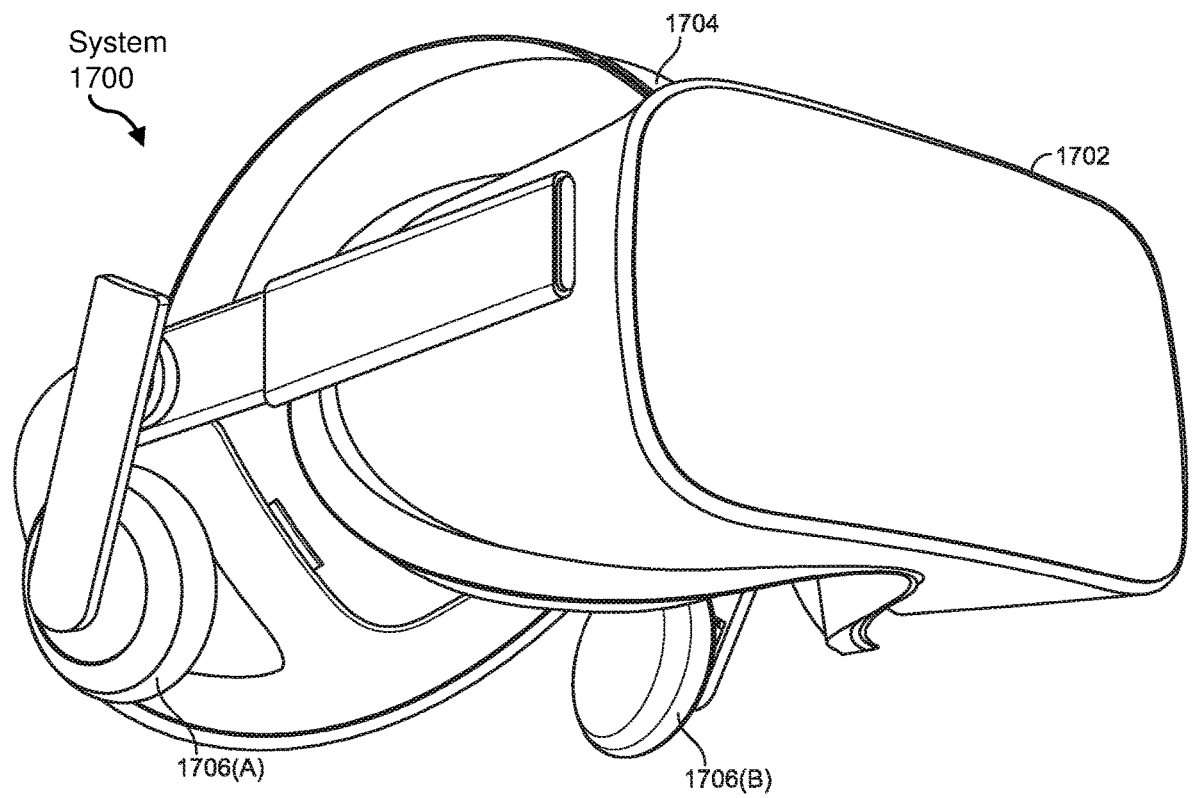
FIG. 17 is an illustration of an exemplary virtual-reality headset that may be used in connection with embodiments of this disclosure.

While not shown in FIGS. 15-17, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 1500, 1600, and 1700 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 18:
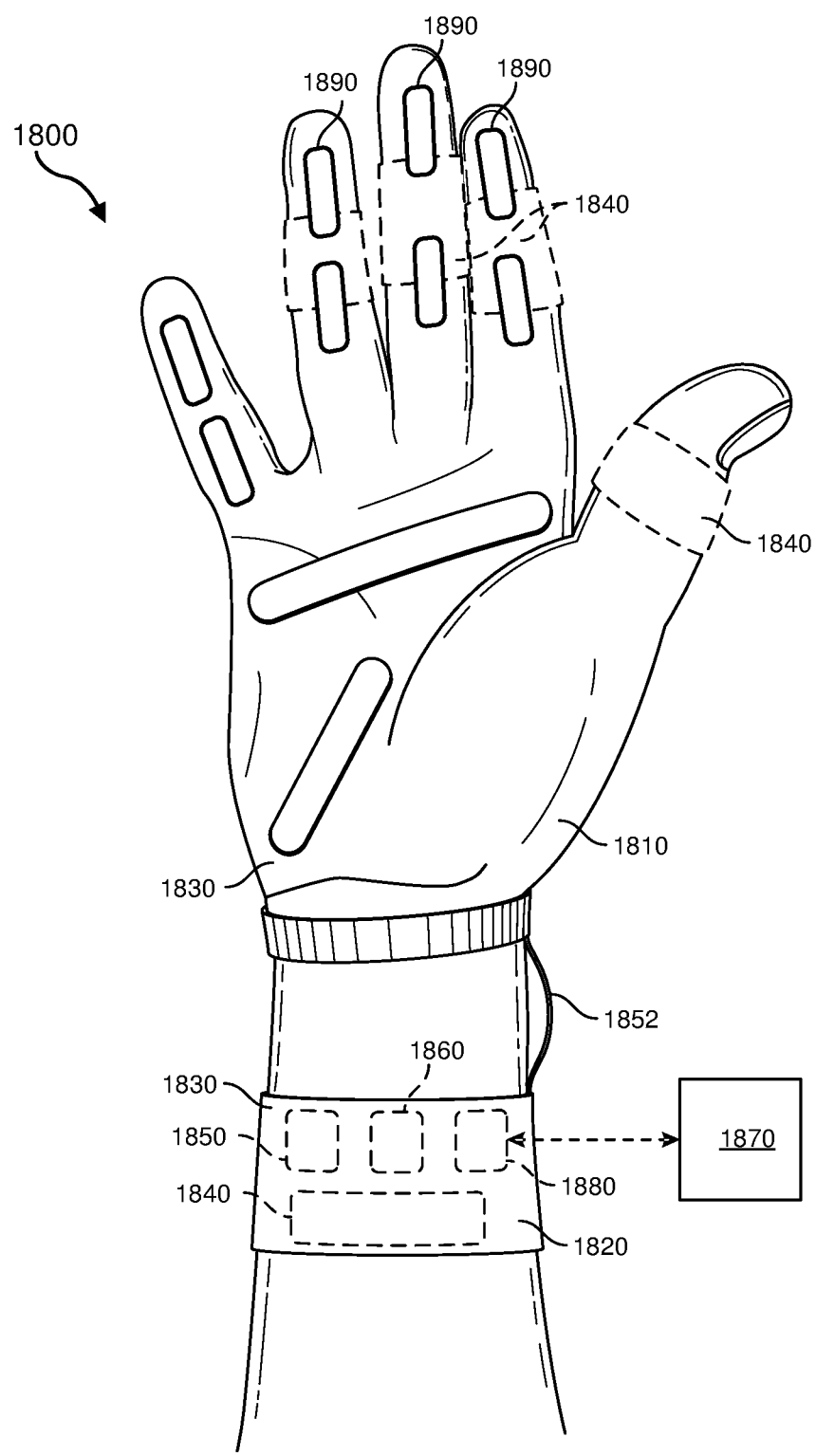
FIG. 18 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 18 illustrates a vibrotactile system 1800 in the form of a wearable glove (haptic device 1810) and wristband (haptic device 1820). Haptic device 1810 and haptic device 1820 are shown as examples of wearable devices that include a flexible, wearable textile material 1830 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, nonwoven fabric, leather, cloth, a flexible polymer material, composite materials, etc.

One or more vibrotactile devices 1840 may be positioned at least partially within one or more corresponding pockets formed in textile material 1830 of vibrotactile system 1800. Vibrotactile devices 1840 may be positioned in locations to provide a vibrating sensation (e.g., haptic feedback) to a user of vibrotactile system 1800. For example, vibrotactile devices 1840 may be positioned to be against the user's finger(s), thumb, or wrist, as shown in FIG. 18. Vibrotactile devices 1840 may, in some examples, be sufficiently flexible to conform to or bend with the user's corresponding body part(s).

A power source 1850 (e.g., a battery) for applying a voltage to the vibrotactile devices 1840 for activation thereof may be electrically coupled to vibrotactile devices 1840, such as via conductive wiring 1852. In some examples, each of vibrotactile devices 1840 may be independently electrically coupled to power source 1850 for individual activation. In some embodiments, a processor 1860 may be operatively coupled to power source 1850 and configured (e.g., programmed) to control activation of vibrotactile devices 1840.

Vibrotactile system 1800 may be implemented in a variety of ways. In some examples, vibrotactile system 1800 may be a standalone system with integral subsystems and components for operation independent of other devices and systems. As another example, vibrotactile system 1800 may be configured for interaction with another device or system 1870. For example, vibrotactile system 1800 may, in some examples, include a communications interface 1880 for receiving and/or sending signals to the other device or system 1870. The other device or system 1870 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 1880 may enable communications between vibrotactile system 1800 and the other device or system 1870 via a wireless (e.g., Wi-Fi, Bluetooth, cellular, radio, etc.) link or a wired link. If present, communications interface 1880 may be in communication with processor 1860, such as to provide a signal to processor 1860 to activate or deactivate one or more of the vibrotactile devices 1840.

Vibrotactile system 1800 may optionally include other subsystems and components, such as touch-sensitive pads 1890, pressure sensors, motion sensors, position sensors, lighting elements, and/or user interface elements (e.g., an on/off button, a vibration control element, etc.). During use, vibrotactile devices 1840 may be configured to be activated for a variety of different reasons, such as in response to the user's interaction with user interface elements, a signal from the motion or position sensors, a signal from the touch-sensitive pads 1890, a signal from the pressure sensors, a signal from the other device or system 1870, etc.

Although power source 1850, processor 1860, and communications interface 1880 are illustrated in FIG. 18 as being positioned in haptic device 1820, the present disclosure is not so limited. For example, one or more of power source 1850, processor 1860, or communications interface 1880 may be positioned within haptic device 1810 or within another wearable textile.

Figure 19:
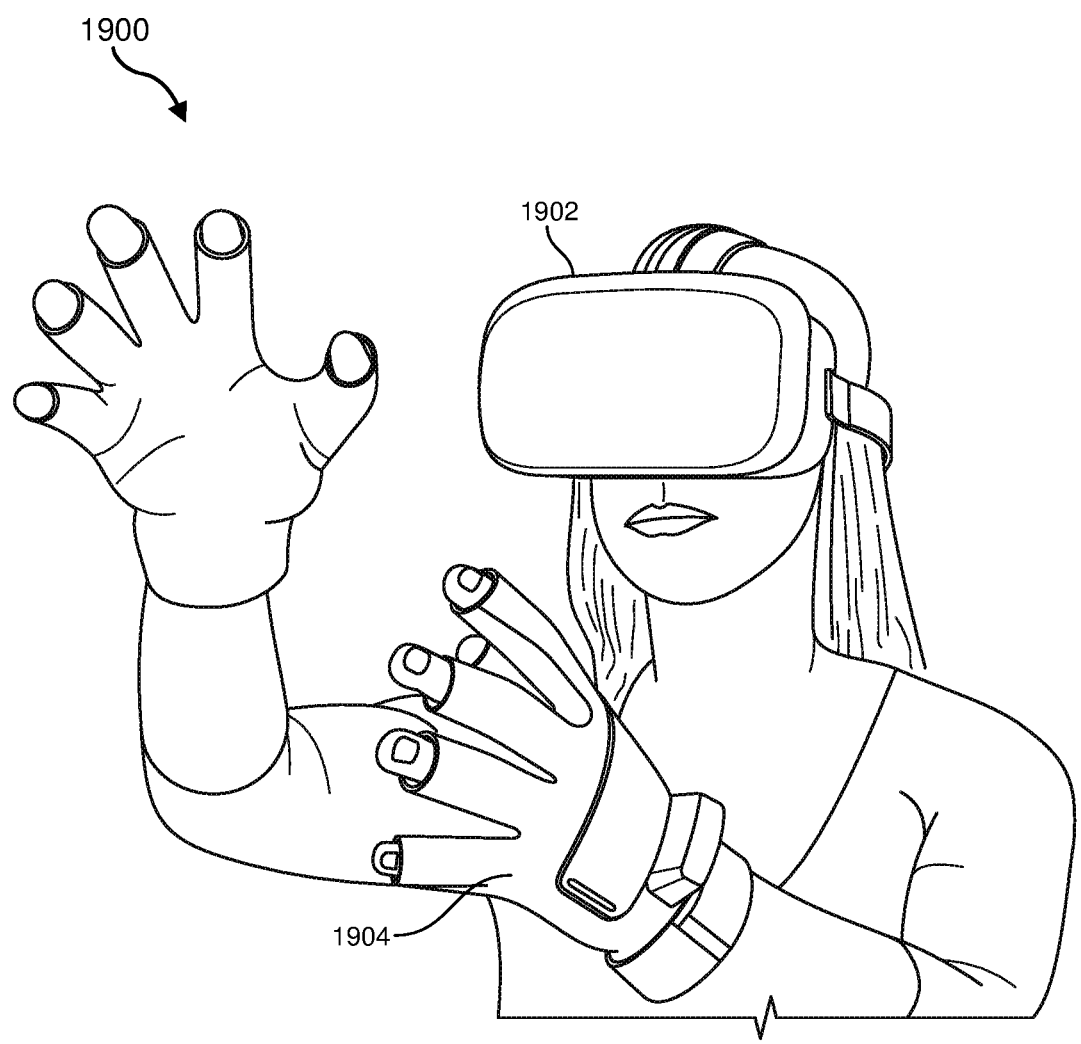
FIG. 19 is an illustration of an exemplary virtual-reality environment according to embodiments of this disclosure.

Haptic wearables, such as those shown in and described in connection with FIG. 18, may be implemented in a variety of types of artificial-reality systems and environments. FIG. 19 shows an example artificial reality environment 1900 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 1902 generally represents any type or form of virtual-reality system, such as virtual-reality system 1700 in FIG. 17. Haptic device 1904 generally represents any type or form of wearable device, worn by a use of an artificial reality system, that provides haptic feedback to the user to give the user the perception that he or she is physically engaging with a virtual object. In some embodiments, haptic device 1904 may provide haptic feedback by applying vibration, motion, and/or force to the user. For example, haptic device 1904 may limit or augment a user's movement. To give a specific example, haptic device 1904 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1904 to send action requests to a console. Examples of action requests include, without limitation, requests to start an application and/or end the application and/or requests to perform a particular action within the application.

Figure 20:
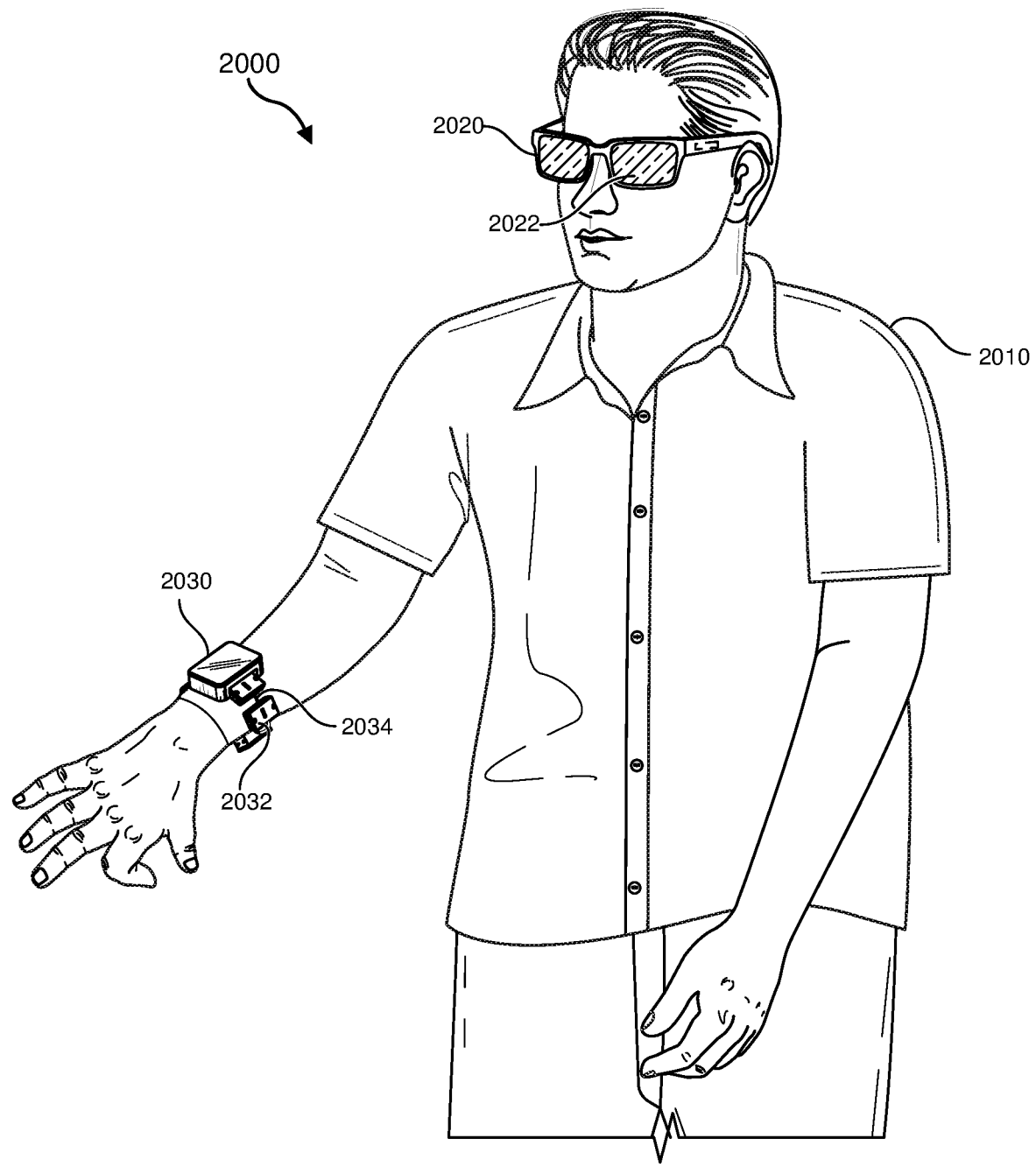
FIG. 20 is an illustration of an exemplary augmented-reality environment according to embodiments of this disclosure.

While haptic interfaces may be used with virtual-reality systems, as shown in FIG. 19, haptic interfaces may also be used with augmented-reality systems, as shown in FIG. 20. FIG. 20 is a perspective view a user 2010 interacting with an augmented-reality system 2000. In this example, user 2010 may wear a pair of augmented-reality glasses 2020 that have one or more displays 2022 and that are paired with a haptic device 2030. Haptic device 2030 may be a wristband that includes a plurality of band elements 2032 and a tensioning mechanism 2034 that connects band elements 2032 to one another.

One or more of band elements 2032 may include any type or form of actuator suitable for providing haptic feedback. For example, one or more of band elements 2032 may be configured to provide one or more of various types of cutaneous feedback, including vibration, force, traction, texture, and/or temperature. To provide such feedback, band elements 2032 may include one or more of various types of actuators. In one example, each of band elements 2032 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1810, 1820, 1904, and 2030 may include any suitable number and/or type of haptic transducer, sensor, and/or feedback mechanism. For example, haptic devices 1810, 1820, 1904, and 2030 may include one or more mechanical transducers, piezoelectric transducers, and/or fluidic transducers. Haptic devices 1810, 1820, 1904, and 2030 may also include various combinations of different types and forms of transducers that work together or independently to enhance a user's artificial-reality experience. In one example, each of band elements 2032 of haptic device 2030 may include a vibrotactor (e.g., a vibrotactile actuator) configured to vibrate in unison or independently to provide one or more of various types of haptic sensations to a user.

Further examples

In some applications, an electroactive device used in connection with the principles disclosed herein may include a first electrode, a second electrode, and an electroactive element disposed between the first electrode and the second electrode. The electroactive element may include an electroactive polymer and a plurality of voids distributed within the electroactive polymer, for example, as a porous polymer structure. Voids may be generally isolated from each other, or, at least in part, be interconnected through an open-cell structure. The plurality of voids may have a non-uniform distribution within the electroactive polymer, and the electroactive element may have a non-uniform electroactive response when an electrical signal is applied between the first electrode and the second electrode, based on the non-uniform distribution of voids.

A non-uniform distribution of the plurality of voids may include a spatial variation in at least one of void diameter, void volume, void number density, void volume fraction, or void orientation (e.g., in the case of anisotropic voids). Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (e.g., parallel to an applied electric field), change in curvature, or other change in a dimensional parameter, such as length, width, height, and the like, in one or more directions. An electroactive device may have a first deformation on application of a first voltage between the first and second electrodes, and a second deformation on application of a second voltage between the first and second electrodes, with the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied r.m.s. electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature.

In some embodiments, an electroactive device may include an optical element mechanically coupled to the electroactive element. An optical element may include at least one of a lens, a grating, a prism, a mirror, or a diffraction grating. In some embodiments, the electroactive device may be a component of a wearable device. The wearable device may include a helmet or other headwear, an eyewear frame, a glove, a belt, or any device configured to be positioned adjacent to or proximate the body of a wearer, for example, to support the electroactive device proximate a user when the user wears the wearable device, and the electroactive device may be configured to provide a tactile signal to the user. In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, with the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion.

The electroactive device may be a component of a wearable device, configured to be worn by a user. The wearable device may be configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger. In some embodiments, a method includes generating an electroactive response in an electroactive device, the electroactive device including an electroactive element located between a first electrode and a second electrode, where the electroactive is response to an electrical input or a mechanical input varies appreciably over a spatial extent of the electroactive device due to a non-uniform distribution of voids within the electroactive element.

In some embodiments, the electroactive response may include a mechanical response to the electrical input that varies over the spatial extent of the electroactive device, with the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal is used to determine a gesture by the user, the gesture including a finger movement. In some embodiments, typing inputs by a user, for example, into a virtual keyboard, may be determined from sensor signals.

In some embodiments, an electroactive device may include one or more electroactive elements, and an electroactive element may include one or more electroactive materials, which may include one or more electroactive polymer materials. In various embodiments, an electroactive device may include a first electrode, a second electrode overlapping at least a portion of the first electrode, and an electroactive element disposed between the first electrode and the second electrode. In some embodiments, the electroactive element may include an electroactive polymer. In some embodiments, an electroactive element may include an elastomer material, which may be a polymer elastomeric material. In some embodiments, the elastomer material may have a Poisson's ratio of approximately 0.35 or less. The electroactive element may be deformable from an initial state to a deformed state when a first voltage is applied between the first electrode and the second electrode, and may further be deformable to a second deformed state when a second voltage is applied between the first electrode and the second electrode.

In some embodiments, there may be one or more additional electrodes, and a common electrode may be electrically coupled to one or more of the additional electrodes. For example, electrodes and electroactive elements may be disposed in a stacked configuration, with a first common electrode coupled to a first plurality of electrodes, and a second common electrode electrically connected to a second electrode, which may be one of a second plurality of electrodes. The first and second pluralities may alternate in a stacked configuration, so that each electroactive element is located between one of the first plurality of electrodes and one of the second plurality of electrodes.

In some embodiments, an electroactive element may have a maximum thickness in an undeformed state and a compressed thickness in a deformed state. In some embodiments, an electroactive element may have a density in an undeformed state that is approximately 90% or less of a density of the electroactive element in the deformed state. In some embodiments, an electroactive element may exhibit a strain of at least approximately 10% when a voltage is applied between the first electrode and the second electrode.

In some embodiments, an electroactive element may include at least one non-polymeric component in a plurality of defined regions and the method may further include removing at least a portion of the at least one non-polymeric component from the cured elastomer material to form a nanovoided polymer material.

In some embodiments, an electroactive device may include an electroactive polymer configured with a first location of patterned nanovoids such that the first location has a different transduction behavior from a second location having a second location of patterned nanovoids. In some embodiments, a global electric field applied over the entirety of an electroactive element generates differential deformation between the first and second locations. An electroactive element may have a plurality of locations of patterned nanovoids such that when a first voltage is applied the EAP exhibits a predetermined compound curvature. The electroactive device may exhibit a second predetermined compound curvature, different from the first predetermined compound curvature, when a second voltage is applied. A wearable device may comprise an electroactive device, where the first compound curvature provides a first tactile feeling and the second compound curvature provides a second tactile feeling to a person when the person is wearing the wearable device. In some electrodes, the first electrode and/or the second electrode may be patterned, allowing a localized electric field to be applied to a portion of the device, for example, to provide a localized compound curvature.

In some embodiments, a sensor may include an electroactive device, where the electroactive device comprises a first and a second portion, where the first portion has a different sensor response than the second portion due to a non-uniform distribution of patterned nanovoids. The sensor may be a wearable device. The sensor may be in electrical communication with a controller configured to determine a flexure of a wearable device based on the one or more electrical outputs from the wearable device. For example, the wearable device may comprise one or more electroactive devices configured as sensors. In some embodiments, a sensor may be configured to determine a joint position of a wearer of the sensor based on the one or more electrical signals from the sensor. The sensors may be part of a glove or other wearable device. In some embodiments, the sensor may include an arrangement of electroactive sensors and may be configured to determine keystrokes into a keyboard, where the keyboard may be a real or virtual keyboard.

A non-uniform distribution of voids within an electroactive element may include a functional dependence on a distance parameter, such as distance from an edge and/or center of an electroactive element. For example, an electroactive element may have a generally rectangular shape with a generally uniform thickness. In some embodiments, the volume fraction of voids may increase monotonically along a direction parallel to a longer side and/or a shorter side of the rectangular shape. In some examples, the void volume fraction may have a highest value in some portion of the electroactive element and decrease from the highest portion to portions with lower void volume fractions elsewhere, for example, proximate an edge. In some examples, the void volume fraction may have a lowest value in some portion of the electroactive element and increase from the lowest portion to portions with higher void volume fractions elsewhere, for example, proximate an edge of the electroactive element. In some examples, an electroactive element may have a generally disk shape. The volume fraction of voids may vary as a function of a radial distance from the disk center. In some embodiments, the volume fraction may be highest in a central portion of a disk-shaped electroactive element and decrease along a radial direction to an edge. In some embodiments, the volume fraction may be lowest in a central portion and increase along a radial direction to an edge. The variation in void volume fraction may have a functional relationship with a distance parameter, for example, including one or more of a linear, quadratic, sinusoidal, undulating, parabolic, or other functional relationship with a distance parameter along one or more of the relevant distance parameters. For example, a distance parameter may be determined as the distance along an edge, obliquely across, from a center, or other distance measurement for a given electroactive element.

An electroactive element can convert deformations into electrical signals, such as proportional electrical signals that scale with a deformation parameter (such as applied pressure). An electroactive element may also receive an electrical signal that induces a deformation based on the electrical signal (e.g., based on the voltage squared or mean square voltage). An electroactive device may be a transducer, with a degree of deformation based on the electrical signal, and/or as a sensor providing an electrical signal based on a degree of deformation. The electroactive response may be mediated by the dielectric constant and elastic modulus of the electroactive element. Using a single homogeneous polymer film constrains the transducer response to a particular input electrical signal/output mechanical response across the device. In some embodiments, an electroactive device actuates and/or senses deformations as a function of position within a single device, without the need for complex electrode structures, facilitating electroactive devices (such as transducers and/or sensors) capable of spatially variable actuation and sensing responses, using a simple electrical architecture such as a pair of electrodes.

In some embodiments, a device may include a transducer that converts variations in a physical quantity into an electrical signal, and/or vice versa. In some embodiments, the electrical response of a transducer may be correlated with a location of a mechanical input. The process by which variations in a physical quantity transforms into an electrical signal, and/or vice versa, may be referred to as transduction. A transducer may include an electroactive element, such an electroactive polymer element. In some examples, an electroactive element may comprise an electroactive polymer with a distribution of voids formed therein.

In some embodiments, an electroactive element may include a distribution of voids. In some embodiments, a void may include a region filled with a different medium, such as a non-polymeric material, such as a gas such as air, or a liquid. A portion of the electroactive element may have a volume fraction of voids, which may be determined as the void volume within a portion of the electroactive element divided by the total volume of the portion of the electroactive element. In some embodiments, the void volume fraction may be a function of a distance parameter. For example, the void volume fraction may be a linear function of a distance from one edge of an electroactive element, for example, increasing in a generally linear fashion from one side to another. In some examples, the volume void fraction may be a non-linear function of a distance parameter, such as a polynomial function (such as a quadratic function), a step function, a parabolic function, an undulating function, a sine function, or the like. A distance parameter may be a distance from an edge of an electroactive element. In some embodiments, an electroactive element may have a generally cuboid shape, for example, having a length, width, and thickness, for example, as determined along generally mutually orthogonal directions. The thickness of the electroactive element may be approximately equal to the electrode separation. In some embodiments, an electroactive element may have a disk shape, a wedge shape, an elongated form such as a rod, or other shape. A distance parameter may be (as appropriate) a distance along an edge (e.g., a distance from one side towards another side), a radial distance (e.g., a distance from a center or an edge of a disk-shaped form in a generally radial direction), or other distance measurement. In some embodiments, a volume void fraction may be a function of a distance parameter over a plurality of electroactive elements, for example, including a plurality of electroactive elements having different mean void volume fractions (optionally having an appreciable internal variation of void volume fraction, or in some embodiments no appreciable internal variation of void volume fraction) arranged to obtain a desired variation of void volume fraction with distance across a plurality of electroactive elements.

In some embodiments, a system may include at least one physical processor, a physical memory including computer-executable instructions that, when executed by the physical processor, cause the physical processor to apply an electrical field across an electroactive device to obtain non-uniform actuation based on a non-uniform distribution of voids within an electroactive element of the electroactive device. In some embodiments, a system may include at least one physical processor, a physical memory including computer-executable instructions that, when executed by the physical processor, cause the physical processor to receive an electrical signal from an electroactive device, and to process the electrical signal to obtain a deformation parameter of the electroactive device, where the deformation parameter includes one or more of the following: a magnitude of a deformation, a location of a deformation, a bend angle, a gesture type (e.g., selected from a plurality of gesture types). The analysis of the electrical signal may be based at least in part on a non-uniform distribution of voids within an electroactive element of the electroactive device.

Electroactive Elements

In some embodiments, the electroactive elements described herein may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongates, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, a polymer element may include an elastomer. As used herein, an "elastomer" may (in some examples) refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, less than approximately 0.05). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, an electroactive element may include an elastomer material, which may have a Poisson's ratio of approximately 0.35 or less. In some embodiments, an electroactive element may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

An electroactive device may include a multilayer, such as a plurality of stacked layers. In some examples, each layer may include an electroactive element disposed between a pair of electrodes. In some examples, an electrode may be shared between layers; for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the electroactive device.

Electroactive Polymers

An electroactive element may include one or more electroactive polymers and may also include additional components. As used herein, "electroactive polymers" may (in some examples) refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications.

In some embodiments, an electroactive polymer may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

Voids

In some embodiments, the electroactive elements described herein may include voids, such as nanovoids (e.g., having a plurality of voids and/or nanoscale-sized voids in an electroactive element including an electroactive polymer or composite thereof). In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the electroactive elements. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, and/or approximately 1000 nm).

In some embodiments, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from an expression $DR=(D_{uncompressed}/D_{compressed})$, where DR may represent the effective density ratio, $D_{uncompressed}$ may represent the density of the uncompressed polymer, and $D_{compressed}$ may represent the density of the compressed polymer.

The density of voids within an electroactive element, or other dielectric material, may vary as a function of position. In some embodiments, the volume fraction of an electroactive component (or dielectric material) may vary between 10% and 60%. The structure of the voids may be interconnected (open cell) or the voids may be fully enclosed by suitable dielectric material (closed cell). The voids may be partially filled with a dielectric liquid or dielectric gas. The voids may be partially coated with a layer of suitable material. In some embodiments, a voided material (such as a porous material) may be fabricated using a templating agent, such as a material that directs the structural formation of pores or other structural elements of an electroactive element. A templating agent may be any phase of matter (solid, liquid, gas). In some embodiments, a templating agent is removed to produce a pore (or void).

Particles

In some embodiments, the electroactive elements described herein may include particles including a material having a high dielectric constant, with the particles having an average diameter between approximately 10 nm and approximately 1000 nm. In some embodiments, the material having the high dielectric constant may include barium titanate.

In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate ($BaTiO_3$), or other perovskite material such as other titanates.

Additionally or alternatively, any other suitable component may be added to the electroactive polymer material. For example, a ferroelectric material such as a titanate, for example, $BaTiO_3$ may be added. $BaTiO_3$ is a ferroelectric material with a relatively high dielectric constant (e.g., a value of between approximately 500 and approximately 7000) and polarization and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, an electroactive device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, for example, by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example, a dielectric liquid or a dielectric gas with high dielectric strength gas, such as a halide, in particular a fluoride such as is sulfur hexafluoride, organofluoride or the like.

Electrodes

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode, or any other electrode) may include a metal such as aluminum, gold, silver, tin, copper, indium, gallium, zinc, and the like. An electrode may include one or more electrically conductive materials, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, electroactive devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, for example, through a contact layer, to a common electrode. In some embodiments, an electroactive device may have a first common electrode, connected to a first plurality of electrodes, and a second common electrode, in some examples connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), e.g., a second electrode and a third electrode located either side of a first electrode. In some embodiments, an electroactive device may include additional electroactive elements interleaved between electrodes, for example, in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, an electroactive device may include more (e.g., two, three, or more) such additional electroactive elements and corresponding electrodes. For example, an electroactive device may include a stack of two or more electroactive elements and corresponding electrodes. For example, an electroactive device may include between 2 electroactive elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements.

In some embodiments, electrodes may be flexible and/or resilient and may stretch, for example, elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where electroactive devices have electroactive elements including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape, or may be a more complex shape (e.g., patterned or freeform). In some embodiments, a common electrode may be shaped to allow compression and expansion of an electroactive device during operation.

Electrode Fabrication

In some embodiments, the electrodes described herein (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example, a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

Lens Assembly and Optical Systems

In some embodiments, the electroactive devices described herein may include or be mechanically coupled to one or more optical elements. An optical element may include a lens, mirror, prism, holographic element, beam splitter, optical filter, diffraction grating, or other optical element. In some embodiments, an electroactive device, such as an actuator, may include or be mechanically coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material multilayer (e.g., including stacked layers) operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In some embodiments, an electroactive device may include one or more direct-drive benders, that may include an electroactive element that is disposed between two electrodes. In such examples, methods of forming an electroactive device may involve forming electrodes and an electroactive polymer simultaneously (e.g., via coflowing, slot die coating, etc.).

In some embodiment, a lens assembly may include multiple deformable optical elements (e.g., multiple deformable lenses, such as liquid lenses), where the deformation is provided by one or more electroactive devices, in accordance with example embodiments of the disclosure.

Methods of Device Fabrication

Various fabrication methods are discussed herein. Properties of the electroactive element may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an electroactive element.

Methods of forming an electroactive device include forming electrodes and electroactive elements sequentially (e.g., via vapor deposition, coating, printing, etc.) or simultaneously (e.g., via co-flowing, coextrusion, slot die coating, etc.). Alternatively, the electroactive elements may be deposited using initiated chemical vapor deposition (iCVD), where, for example, suitable monomers of the desired polymers may be used to form the desired coating. In some embodiments, monomers, oligomers, and/or prepolymers for forming the electroactive elements may optionally be mixed with a solvent and the solvent may be removed from the electroactive element during and/or following curing to form nanovoids within the electroactive element.

A method of fabricating an electroactive device may include depositing a curable material onto a first electrode, curing the deposited curable material to form an electroactive element (e.g., including a cured elastomer material) and depositing an electrically conductive material onto a surface of the electroactive element opposite the first electrode to form a second electrode. In some embodiments, the cured elastomer material may have a Poisson's ratio of approximately 0.35 or less. In some embodiments, a method may further include depositing an additional curable material onto a surface of the second electrode opposite the electroactive element, curing the deposited additional curable material to form a second electroactive element including a second cured elastomer material, and depositing an additional electrically conductive material onto a surface of the second electroactive element opposite the second electrode to form a third electrode.

In some embodiments, a method of fabricating an electroactive element may include vaporizing a curable material, or a precursor thereof, where depositing the curable material may include depositing the vaporized curable material onto the first electrode. In some embodiments, a method of fabricating an electroactive element may include printing the polymer or precursor thereof (such as a curable material)

onto an electrode. In some embodiments, a method may also include combining a polymer precursor material with at least one other component to form a deposition mixture. In some embodiments, a method may include combining a curable material with particles of a material having a high dielectric constant to form a deposition mixture.

According to some embodiments, a method may include positioning a curable material between a first electrically conductive material and a second electrically conductive material. The positioned curable material may be cured to form an electroactive element including a cured elastomer material. In some embodiments, the cured elastomer material may have a Poisson's ratio of approximately 0.35 or less. In some embodiments, at least one of the first electrically conductive material or the second electrically conductive material may include a curable electrically conductive material, and the method may further include curing the at least one of the first electrically conductive material or the second electrically conductive material to form an electrode. In this example, curing the at least one of the first electrically conductive material or the second electrically conductive material may include curing the at least one of the first electrically conductive material or the second electrically conductive material during curing of the positioned curable material.

In some embodiments, a curable material and at least one of a first electrically conductive material or a second electrically conductive material may be flowable during positioning of the curable material between the first and second electrodes. A method of fabricating an electroactive device may further include flowing a curable material and at least one of the first electrically conductive material or the second electrically conductive material simultaneously onto a substrate.

In some embodiments, methods for fabricating an electroactive device (e.g., an actuator) may include masks (e.g., shadow masks) to control the patterns of deposited materials to form the electroactive device. In some embodiments, the electroactive device may be fabricated on a surface enclosed by a deposition chamber, which may be evacuated (e.g., using one or more mechanical vacuum pumps to a predetermined level such as 10-6 Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials (e.g., electrodes, polymer elements, and the like) that are mechanically coupled to the surface. In some embodiments, the surface may be fixed and the deposition and curing systems may move relative to the surface, or both the surface, the deposition, and/or curing systems may be moving simultaneously.

In some embodiments, an electroactive device (e.g., an actuator, sensor, or the like) may be fabricated by: providing an electrically conductive layer (e.g., a first electrode) having a first surface; depositing (e.g., vapor depositing) a polymer (e.g., an electroactive polymer) or polymer precursor (such as a monomer) onto the electrode; as needed, forming a polymer such as an electroactive polymer from the polymer precursor (e.g., by curing or a similar process); and depositing another electrically conductive layer (e.g., a second electrode) onto the electroactive polymer. In some embodiments, the method may further include repeating one or more of the above to fabricate additional layers (e.g., second electroactive element, other electrodes, alternating stack of polymer layers and electrodes, and the like. An electroactive device may have a stacked configuration.

In some embodiments, an electroactive device may be fabricated by first depositing a first electrode, and then depositing a curable material (e.g., a monomer) on the first electrode (e.g., deposited using a vapor deposition process). In some embodiments, an inlet (not shown) to a deposition chamber may open and may input an appropriate monomer initiator for starting a chemical reaction. In some embodiments, "monomer," as used herein, may refer to a monomer that forms a given polymer (i.e., as part of an electroactive element). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable material may be cured with a source of radiation (e.g., electromagnetic radiation, such as UV and/or visible light) to form an electroactive element that includes a cured elastomer material, for example, by photopolymerization. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form an electroactive element. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured elastomer material may include at least one non-polymeric component in a plurality of defined regions and the method may further include removing at least a portion of the at least one non-polymeric component from the cured elastomer material to form a voided (e.g., nanovoided) polymer element.

An electrically conductive material may then be deposited onto a surface of the first electroactive element opposite a first electrode to form a second electrode. An additional curable material may be deposited onto a surface of the second electrode opposite the electroactive element. For example, the deposited additional curable material may be cured to form a second electroactive element, for example, including a second cured elastomer material. In some embodiments, an additional electrically conductive material may be deposited onto a surface of the second electroactive element opposite the second electrode to form a third electrode.

In some embodiments, a deposition chamber may have an exhaust port configured to open to release at least a portion of the vapor in the chamber during and/or between one or more depositions of the materials (e.g., monomers, oligomers, monomer initiators, conductive materials, etc.). In some embodiments, a deposition chamber may be purged (e.g., with a gas or the application of a vacuum, or both) to remove a portion of the vapor (e.g., monomers, oligomers, monomer initiators, metal particles, and any resultant by-products). Thereafter, one or more of the previous steps may be repeated (e.g., for a second electroactive element, and the like). In this way, individual layers of an electroactive device may be maintained at high purity levels.

In some embodiments, the deposition of the materials (e.g., monomers, oligomers, monomer initiators, conductive materials, etc.) of the electroactive device may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more electrodes, electroactive polymers, etc.). Frequently, volatile by-products are also produced, which may be removed by gas flow through the chamber.

In some embodiments, an electroactive device may be fabricated using an atmospheric pressure CVD (APCVD) coating formation technique (e.g., CVD at atmospheric pressure). In some embodiments, an electroactive device may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately $10^{-6}$ Pa (equivalently, approximately $10^{-8}$ torr)).

In some embodiments, an electroactive device may be fabricated using an aerosol assisted CVD (AACVD) process (e.g., a CVD in which the precursors are transported to the electroactive device) by means of a liquid/gas aerosol, which may be generated ultrasonically or with electrospray. In some embodiments, AACVD may be used with non-volatile precursors. In some embodiments, an electroactive device may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to the electroactive device as in CVD. DLICVD may be used on liquid or solid precursors, and high growth rates for the deposited materials may be reached using this technique.

In some embodiments, an electroactive device may be fabricated using a hot wall CVD process (e.g., CVD in which the deposition chamber is heated by an external power source and the electroactive device is heated by radiation from the heated wall of the deposition chamber). In another aspect, an electroactive device may be fabricated using a cold wall CVD process (e.g., a CVD in which only the electroactive device is directly heated, for example, by induction, while the walls of the chamber are maintained at room temperature).

In some embodiments, an electroactive device may be fabricated using a microwave plasma-assisted CVD (MPCVD) process, where microwaves are used to enhance chemical reaction rates of the precursors. In another aspect, an electroactive device may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the electroactive device or in depositing certain materials (e.g., organic materials and/or some polymers).

In some embodiments, an electroactive device may be fabricated using a remote plasma-enhanced CVD (RPECVD) process. In some embodiments, RPECVD may be similar to PECVD except that the electroactive device may not be directly in the plasma discharge region. In some embodiments, the removal of the electroactive device from the plasma region may allow for the reduction of processing temperatures down to room temperature.

In some embodiments, an electroactive device may be fabricated using an atomic-layer CVD (ALCVD) process. In some embodiments, ALCVD may deposit successive layers of different substances to produce layered, crystalline film coatings on the electroactive device.

In some embodiments, an electroactive device may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the electroactive device.

In some embodiments, an electroactive device may be fabricated using a hot filament CVD (HFCVD) process, which may also be referred to as catalytic CVD (cat-CVD) or initiated CVD (iCVD). In some embodiments, this process may use a hot filament to chemically decompose the source gases to form the materials of the electroactive device. Moreover, the filament temperature and temperature of portions of the electroactive device may be independently controlled, allowing colder temperatures for better adsorption rates at the electroactive device, and higher temperatures necessary for decomposition of precursors to free radicals at the filament.

In some embodiments, an electroactive device may be fabricated using a hybrid physical-chemical vapor deposition (HPCVD) process. HPCVD may involve both chemical decomposition of precursor gas and vaporization of a solid source to form the materials on the electroactive device.

In some embodiments, an electroactive device may be fabricated using metalorganic chemical vapor deposition (MOCVD) process (e.g., a CVD that uses metalorganic precursors) to form materials on the electroactive device. For example, an electrode may be formed on an electroactive element using this approach.

In some embodiments, an electroactive device may be fabricated using a rapid thermal CVD (RTCVD) process. This CVD process uses heating lamps or other methods to rapidly heat the electroactive device. Heating only the electroactive device rather than the precursors or chamber walls may reduce unwanted gas-phase reactions that may lead to particle formation in the electroactive device.

In some embodiments, an electroactive device may be fabricated using a photo-initiated CVD (PICVD) process. This process may use UV light to stimulate chemical reactions in the precursor materials used to make the materials for the electroactive device. Under certain conditions, PICVD may be operated at or near atmospheric pressure.

In some embodiments, electroactive devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, the flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component, for example, on an electrode (e.g., a first electrode or a second electrode) of the electroactive device. Alternatively, the flowable material (e.g., solvent) may be introduced into a vaporizer to deposit (e.g., via vaporization or, in alternative embodiments, via printing) a curable material onto an electrode. In some embodiments, a flowable material (e.g., solvent) may be deposited as a separate layer either on top or below a curable material (e.g., a monomer) and the solvent and curable material may be allowed to diffuse into each other before being cured by the source of radiation to generate an electroactive polymer having nanovoids. In some embodiments, after the curable material is cured, the solvent may be allowed to evaporate before another electroactive polymer or another electrode is formed. In some embodiments, the evaporation of the solvent may be accelerated by the application of heat to the surface with a heater, which may, for example, by disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated electroactive polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers and may at least partially phase separate when condensed on the substrate.

In some embodiments, there may be multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (e.g., SPAN 80, available from Sigma-Aldrich Company). In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

As discussed throughout the instant disclosure, the disclosed devices, systems, and methods may provide one or more advantages over conventional devices, systems, and methods. For example, in contrast to prior devices, the electroactive devices presented herein may include electroactive elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, an electroactive device may be formed in a stacked structure having a plurality of electroactive elements that are layered with multiple electrodes, enabling the plurality of electroactive elements to be actuated in conjunction with each other in a single device that may undergo a more substantial degree of deformation (e.g., compression and/or expansion) in comparison to an electroactive device having a single electroactive element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
    a nanovoided polymer element having a first surface and a second surface;
    a first plurality of electrodes disposed on the first surface;
    a second electrode disposed on the second surface; and
    a control circuit configured to apply an electrical potential between one or more of the first plurality of electrodes and the second electrode to induce a physical deformation of the nanovoided polymer element,
    wherein the control circuit is configured to apply different voltages to each electrode of the first plurality of electrodes to obtain a spatially varying deformation of the first surface of the nanovoided polymer element.

2. The device of claim 1, wherein the control circuit is further configured to determine the physical deformation of the nanovoided polymer element using a capacitance measurement between one or more of the first plurality of electrodes and the second electrode.

3. The device of claim 1, wherein the device includes a second plurality of electrodes disposed on the second surface, the second plurality of electrodes including the second electrode.

4. The device of claim 1, wherein the device is a spatially addressable actuator, and
    the physical deformation includes a spatially varying compression of the nanovoided polymer element.

5. The device of claim 1, wherein the nanovoided polymer element is flexible.

6. The device of claim 1, wherein the nanovoided polymer element includes a polymer having a plurality of nanovoids disposed therein.

7. The device of claim 6, wherein the polymer comprises an acrylate polymer or a silicone polymer.

8. The device of claim 1, wherein the nanovoided polymer element is generally transparent,
    the first plurality of electrodes is transparent or reflective, and
    the second electrode is transparent or reflective.

9. The device of claim 8, wherein the physical deformation of the nanovoided polymer element induces a spatially varying refractive index of the nanovoided polymer element.

10. The device of claim 1, wherein the device includes an electrically controllable optical element.

11. The device of claim 10, wherein the electrically controllable optical element comprises one or more of a mirror, a lens, a prism, a grating, a phase plate, a diffuser, a holographic element, a beam splitter, a beam combiner, or an optical filter.

12. The device of claim 10, wherein the electrically controllable optical element includes a mirror, and the physical deformation of the nanovoided polymer element induces the spatially varying deformation of the mirror.

13. A device comprising:
a nanovoided polymer element having a first surface and a second surface;
a first plurality of electrodes disposed on the first surface, wherein the first plurality of electrodes comprises a first electrode;
a second electrode disposed on the second surface, wherein the nanovoided polymer element is located at least in part between the first plurality of electrodes and the second electrode; and
a control circuit, wherein the control circuit is configured to:
apply different voltages to each electrode of the first plurality of electrodes to obtain a spatially varying deformation of the first surface of the nanovoided polymer element; and
determine an electrical capacitance between the first electrode and the second electrode to determine a deformation parameter of the spatially varying deformation.

14. The device of claim 13, wherein the device includes an electrically controllable optical element.

15. The device of claim 14, wherein the electrically controllable optical element comprises one or more of a mirror, a lens, a prism, a grating, a phase plate, a diffuser, a holographic element, a beam splitter, a beam combiner, or an optical filter.

16. The device of claim 14, wherein the electrically controllable optical element includes a mirror disposed on the first surface.

17. The device of claim 13, wherein the device comprises an actuator controlled by an electrical potential applied between the first electrode and the second electrode, and
the deformation parameter includes a change in an electrode separation between the first electrode and the second electrode.

18. A method comprising:
applying electrical signals to a plurality of electrodes of an electroactive device comprising a nanovoided polymer element having a first surface and a second surface to obtain a surface deformation of the electroactive device, wherein:
the electroactive device comprises the plurality of electrodes disposed on the first surface and a second electrode disposed on the second surface; and
applying electrical signals comprises applying different voltages to each electrode of the plurality of electrodes using a control circuit to obtain a spatially varying deformation of the first surface of the nanovoided polymer element.

19. The method of claim 18, further comprising determining a capacitance between one or more pairs of electrodes within the plurality of electrodes to determine the surface deformation of the electroactive device.

20. The method of claim 18, wherein the surface deformation is induced within a haptic device.

* * * * *